US008067858B2

(12) United States Patent
Bachmann

(10) Patent No.: US 8,067,858 B2
(45) Date of Patent: Nov. 29, 2011

(54) LOW-DISTORTION VOLTAGE VARIABLE CAPACITOR ASSEMBLIES

(75) Inventor: Heinz G. Bachmann, Stow, MA (US)

(73) Assignee: Paratek Microwave, Inc., Nashua, NH (US)

( * ) Notice: Subject to any disclaimer, the term of this patent is extended or adjusted under 35 U.S.C. 154(b) by 258 days.

(21) Appl. No.: 12/287,807

(22) Filed: Oct. 14, 2008

(65) Prior Publication Data

US 2010/0090760 A1 Apr. 15, 2010

(51) Int. Cl.
*H02M 3/06* (2006.01)
*H03B 5/08* (2006.01)

(52) U.S. Cl. .................... 307/109; 331/177 V

(58) Field of Classification Search ............. 331/36 C, 331/177 V; 334/12, 14, 15, 64, 65, 78; 361/271, 361/277, 280, 281; 307/109, 110
See application file for complete search history.

(56) References Cited

U.S. PATENT DOCUMENTS

| | | | |
|---|---|---|---|
| 2,745,067 A | 5/1956 | True | |
| 3,117,279 A | 1/1964 | Ludvigson | |
| 3,160,832 A | 12/1964 | Beitman | |
| 3,390,337 A | 6/1968 | Beitman | |
| 3,443,231 A | 5/1969 | Roza | |
| 3,509,500 A | 4/1970 | McNair | |
| 3,571,716 A | 3/1971 | Hill | |
| 3,590,385 A | 6/1971 | Sabo | |
| 3,601,717 A | 8/1971 | Kuecken | |
| 3,794,941 A | 2/1974 | Templin | |
| 3,919,644 A | 11/1975 | Smolka | |
| 3,990,024 A | 11/1976 | Hou | |
| 3,995,237 A | 11/1976 | Brunner | |
| 4,186,359 A | 1/1980 | Kaegebein | |
| 4,201,960 A | 5/1980 | Skutta | |
| 4,227,256 A | 10/1980 | O'Keefe | |
| 4,493,112 A | 1/1985 | Bruene | |
| 4,799,066 A | 1/1989 | Deacon | |
| 5,032,805 A | 7/1991 | Elmer | |
| 5,142,255 A | 8/1992 | Chang | |
| 5,195,045 A | 3/1993 | Keane | |
| 5,200,826 A | 4/1993 | Seong | |
| 5,212,463 A | 5/1993 | Babbitt | |
| 5,258,728 A | 11/1993 | Taniyoshi | |
| 5,301,358 A | 4/1994 | Gaskill et al. | |
| 5,307,033 A | 4/1994 | Koscica | |
| 5,312,790 A | 5/1994 | Sengupta | |
| 5,334,958 A | 8/1994 | Babbitt | |

(Continued)

*Primary Examiner* — David Mis
(74) *Attorney, Agent, or Firm* — Andrew Gust; Guntin Meles & Gust, PLC

(57) ABSTRACT

An embodiment of the present invention provides an apparatus, comprising a first half cell comprising a circuit with two or more voltage variable capacitors (VVCs) configured in anti-series in which one or more of the two or more VVCs with the same bias voltage orientation as a signal voltage associated with the apparatus assume one capacitance and one or more of the two or more VVCs with the opposite bias voltage orientation as the signal voltage assume another capacitance, and a second half cell connected in parallel to the first half cell, comprising a circuit with two or more VVCs configured in anti series in which one or more of the two or more VVCs with the same bias voltage orientation as a signal voltage associated with the apparatus assume the same values as the anti-oriented VVCs in the first half cell and a one or more VVCs with the opposite bias voltage orientation as a signal voltage assume the same values as the like oriented VVCs in the first half cell.

20 Claims, 16 Drawing Sheets

U.S. PATENT DOCUMENTS

| | | |
|---|---|---|
| 5,409,889 A | 4/1995 | Das |
| 5,427,988 A | 6/1995 | Sengupta |
| 5,430,417 A | 7/1995 | Martin |
| 5,439,849 A | 8/1995 | McBride et al. .............. 438/763 |
| 5,446,447 A | 8/1995 | Carney |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,561,407 A | 10/1996 | Koscica |
| 5,564,086 A | 10/1996 | Cygan |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,766,697 A | 6/1998 | Sengupta |
| 5,786,727 A | 7/1998 | Sigmon |
| 5,830,591 A | 11/1998 | Sengupta |
| 5,846,893 A | 12/1998 | Sengupta |
| 5,874,926 A | 2/1999 | Tsuru |
| 5,886,867 A | 3/1999 | Chivukula |
| 5,990,766 A | 11/1999 | Zhang |
| 6,009,124 A | 12/1999 | Smith |
| 6,020,787 A | 2/2000 | Kim |
| 6,029,075 A | 2/2000 | Das |
| 6,045,932 A | 4/2000 | Jia |
| 6,061,025 A | 5/2000 | Jackson |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,133,883 A | 10/2000 | Munson |
| 6,377,142 B1 | 4/2002 | Chiu |
| 6,377,217 B1 | 4/2002 | Zhu |
| 6,377,440 B1 | 4/2002 | Zhu |
| 6,404,614 B1 | 6/2002 | Zhu |
| 6,414,562 B1 | 7/2002 | Bouisse |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Patridge |
| 6,538,603 B1 | 3/2003 | Chen |
| 6,556,102 B1 | 4/2003 | Sengupta |
| 6,570,462 B2 | 5/2003 | Edmonson |
| 6,590,468 B2 | 7/2003 | du Toit et al. |
| 6,590,541 B1 | 7/2003 | Schultze |
| 6,597,265 B2 | 7/2003 | Liang |
| 6,657,595 B1 | 12/2003 | Phillips |
| 6,710,651 B2 | 3/2004 | Forrester |
| 6,737,179 B2 | 5/2004 | Sengupta |
| 6,759,918 B2 | 7/2004 | du Toit et al. |
| 6,765,540 B2 | 7/2004 | Toncich |
| 6,774,077 B2 | 8/2004 | Sengupta |
| 6,795,712 B1 | 9/2004 | Vakilian |
| 6,825,818 B2 | 11/2004 | Toncich |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | du Toit et al. |
| 6,868,260 B2 | 3/2005 | Jagielski |
| 6,905,989 B2 | 6/2005 | Ellis |
| 6,907,234 B2 | 6/2005 | Karr |
| 6,920,315 B1 | 7/2005 | Wilcox |
| 6,961,368 B2 | 11/2005 | Dent |
| 6,965,837 B2 | 11/2005 | Vintola |
| 6,993,297 B2 | 1/2006 | Smith |
| 7,009,455 B2 | 3/2006 | Toncich et al. |
| 7,071,776 B2 | 7/2006 | Forrester et al. |
| 7,113,614 B2 | 9/2006 | Rhoads |
| 7,151,411 B2 | 12/2006 | Martin |
| 7,176,845 B2 | 2/2007 | Fabrega-Sanchez et al. |
| 7,180,467 B2 | 2/2007 | Fabrega-Sanchez et al. |
| 7,221,327 B2 | 5/2007 | Toncich |
| 7,339,527 B2 | 3/2008 | Sager |
| 7,426,373 B2 | 9/2008 | Clingman |
| 2002/0191703 A1 | 12/2002 | Ling |
| 2002/0193088 A1 | 12/2002 | Jung |
| 2003/0232607 A1 | 12/2003 | Le Bars |
| 2004/0009754 A1 | 1/2004 | Smith, Jr. |
| 2004/0137950 A1 | 7/2004 | Bolin |
| 2004/0202399 A1 | 10/2004 | Kochergin |
| 2004/0257293 A1 | 12/2004 | Friedrich |
| 2005/0042994 A1 | 2/2005 | Otaka |
| 2005/0093624 A1 | 5/2005 | Forrester |
| 2005/0215204 A1 | 9/2005 | Wallace |
| 2005/0282503 A1 | 12/2005 | Onno |
| 2006/0183442 A1 | 8/2006 | Chang |
| 2006/0281423 A1 | 12/2006 | Caimi |
| 2007/0013483 A1 | 1/2007 | Stewart |
| 2007/0042734 A1 | 2/2007 | Ryu |
| 2007/0080888 A1 | 4/2007 | Mohamadi |
| 2007/0197180 A1 | 8/2007 | McKinzie, III |
| 2008/0055016 A1 | 3/2008 | Morris |
| 2009/0134960 A1* | 5/2009 | Larson et al. ................... 334/78 |
| 2009/0160263 A1* | 6/2009 | Spears et al. ................... 307/109 |

\* cited by examiner

LOW-DISTORTION VOLTAGE VARIABLE CAPACITOR ASSEMBLIES

BACKGROUND

Voltage Variable Capacitors (VVCs) such as varactor diodes or voltage tunable dielectric capacitors are devices whose capacitance changes as a function of the applied voltage. This makes them useful in circuits such as voltage-controlled oscillators or voltage controlled matching networks where a tuning or bias voltage is applied to bring the VVC to the capacitance required for the circuit to work with a signal voltage, typically a modulated AC signal.

When the amplitude of the AC signal is not much less than the bias voltage, it itself affects the capacitance as it goes through a cycle. The capacitance is no longer constant and so a perfect sine wave applied to the capacitance is no longer a perfect sine wave but contains harmonics. In the presence of more than one sine wave, there are also mixing products while a modulated signal will experience spectral regrowth. Harmonics will be generated in the circuit as shown in FIG. 1, shown generally as 100, where $V_S$ 120 is a perfect sinusoidal voltage source and $V_B$ 110 is the applied bias voltage.

Rw 130, the impedance of the voltage source, is of the same order of magnitude as the impedance of the VVC at the signal frequency, i.e., $1/(\omega \cdot C)$, where $\omega$ is the angular frequency ($2 \times \pi \times$ frequency in Hz) of the signal voltage and C is the capacitance of the VVC. The DC feed is a means of applying the DC bias voltage $V_B$ 110 to the VVC so that it attains the desired capacitance without providing a connection to ground for the signal voltage and thus affecting the AC characteristics of the circuit. The DC feed could be implemented in a number of ways, such as with a resistor Rb that is much greater than $1/(\omega \cdot C)$ but much less than the DC leakage resistance of the VVC, or with an inductor of a value L such that its impedance $\omega \cdot L$ is much greater than $1/(\omega \cdot C)$.

Thus, there is a strong need for an invention that would eliminate this non-linear behavior and make the capacitance of the VVC dependent on the bias voltage $V_B$ 110 but independent of the AC voltage $V_S$ 120.

SUMMARY OF THE INVENTION

An embodiment of the present invention provides an apparatus, comprising a first half cell comprising a circuit with two or more voltage variable capacitors (VVCs) configured in anti-series in which one or more of the two or more VVCs with the same bias voltage orientation as a signal voltage associated with the apparatus assume one capacitance and one or more of the two or more VVCs with the opposite bias voltage orientation as the signal voltage assume another capacitance, and a second half cell connected in parallel to the first half cell, comprising a circuit with two or more VVCs configured in anti series in which one or more of the two or more VVCs with the same bias voltage orientation as a signal voltage associated with the apparatus assume the same values as the anti-oriented VVCs in the first half cell and one or more VVCs with the opposite bias voltage orientation as a signal voltage assume the same values as the like oriented VVCs in the first half cell.

A further embodiment of the present invention provides a method, comprising concatenating a first half cell with a second half cell, wherein the first half cell comprises a circuit with two or more voltage variable capacitors (VVCs) configured in anti-series in which one or more of the two or more VVCs with the same bias voltage orientation as a signal voltage assume one capacitance and one or more of the two or more VVCs with the opposite bias orientation as the signal voltage assume another capacitance, and the second half cell comprises a circuit with two or more VVCs configured in anti series in which one or more of the two or more VVCs with the same bias voltage orientation as a signal voltage assume the same values as the anti oriented VVCs in the first half cell and one or more of the two or more VVCs with the opposite bias voltage orientation as a signal voltage assume the same values as the like oriented VVCs in the first half cell and setting a required bias voltage to allow for a desired total capacitance minimally dependent of the signal voltage.

Yet another embodiment of the present invention provides an apparatus, comprising a cell including a first half-cell and a second half-cell and wherein the first half cell comprises a circuit with a non variable capacitor and with two or more voltage variable capacitors (VVCs) configured in anti-series in which all VVCs have the same bias voltage orientation as a signal voltage associated with the apparatus and assume one capacitance and the second half cell comprises a circuit with a non variable capacitor and with two or more VVCs configured in anti series in which all VVCs have the opposite bias voltage orientation as a signal voltage associated with the apparatus and assumes the same values as the VVCs in the first half cell and placed in parallel to the first half cell.

Still another embodiment of the present invention provides an apparatus, comprising a cell including a first half-cell and a second half-cell and wherein the first half cell comprises a circuit with a non variable capacitor and with two or more voltage variable capacitors (VVCs) configured in anti-series in which all VVCs have the same bias voltage orientation as a signal voltage associated with the apparatus and assume one capacitance and the second half cell comprises a circuit with a non variable capacitor and with two or more VVCs configured in anti series in which all VVCs have the opposite bias voltage orientation as a signal voltage associated with the apparatus and assumes the same values as the VVCs in the first half cell and placed in parallel to the first half cell.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g. as in a cause an effect relationship).

Methods to reduce voltage variable capacitor (VVC) distortion have been devised; such as provided by R. G. Meyer and M. L. Stephens, in a 1975 paper entitled, "Distortion in variable-capacitance diodes," J. Solid-State Circuits, vol. SSC-10, no. 1, pp. 47-55, February 1975. However, these previous methods assume VVCs with a capacitance-voltage (CV) dependency that follows the equation $$C(V) = \frac{K}{(\Phi + V)^n}$$

where C is the incremental diode capacitance dQ/dV (where Q is the charge on the VVC), Φ is the built-in potential, K is a constant, V is the total voltage applied to the VVC and n is a power law exponent. This is not the case for all VVCs and certainly not for voltage tunable dielectric capacitors. There is thus a need for a method that reduces distortion when other VVCs are used. One method employed is the circuit topology shown generally as 200 of FIG. 2. $C_1$ 210 and $C_2$ 220 are nominally twice the desired capacitance. During the positive phase of the cycle of $V_C$, $C_1$ decreases while $C_2$ increases, during the negative phase this is reversed. The capacitance changes of the individual VVCs thus partially offset each other, resulting in less dependency of the total capacitance on $V_C$ and thus less harmonic distortion. However, this correction is not perfect.

Figure 3:
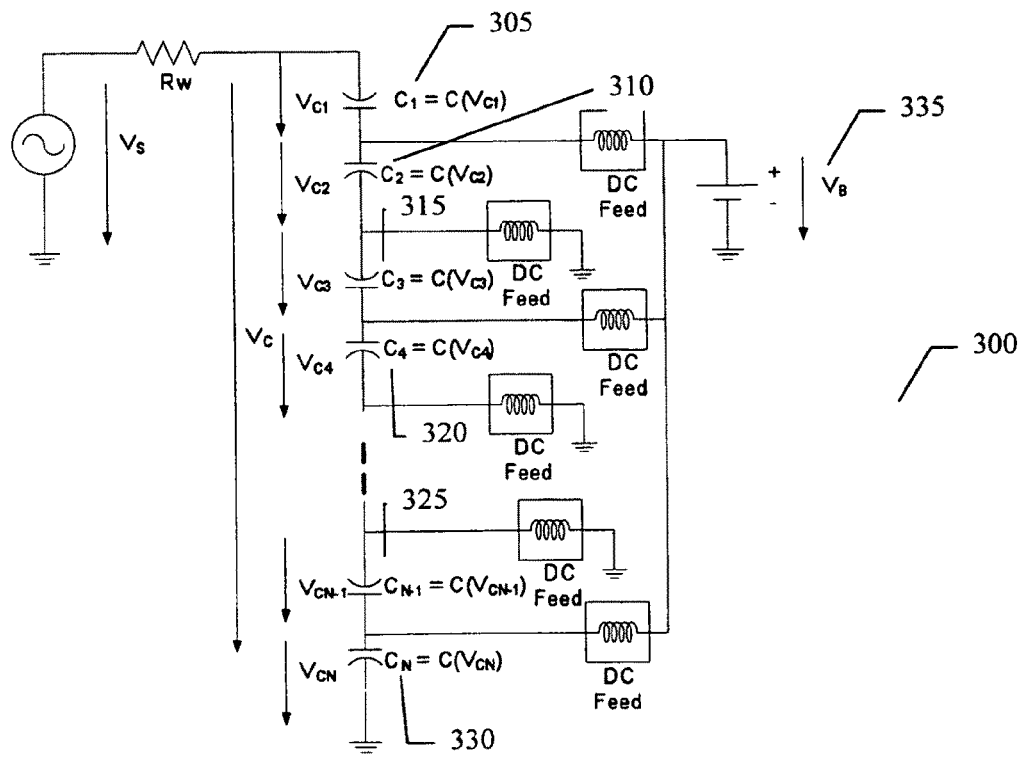
FIG. 3 shows a prior art circuit stacking of VVCs.

Another method used is shown generally as 300 of FIG. 3. Each capacitance value is N×the desired total capacitance. The AC voltage divides over N VVCs (e.g., $C_1$, $C_2$, $C_3$, $C_4$, $C_{N-1}$ and $C_N$, 305, 310, 315, 320, 325 and 330 respectively) so that each one is less affected and the total capacitance change over an AC cycle is reduced. However, the total capacitance that must be charged is now $N^2$×the desired capacitance, which results in greater time to tune to a desired capacitance and greater current that must be provided by the source of $V_B$ 335.

Some embodiments of the present invention allow a desired total capacitance of a circuit consisting of four or more VVCs to be attained by setting the required bias voltage while making the total capacitance of the circuit as independent of the signal voltage as possible. The less the capacitive variation with signal voltage, the less severe the problem described above, and the more linear is the VVC network.

Prior art, such as Buisman et. al. (K. Buisman, L. C. N. de Vreede, L. E. Larson, M. Spirito, A. Akhnoukh, T. L. M. Scholtes and L. K. Nanver, "Distortion-Free" Varactor Topologies for RF Adaptivity, Microwave Symposium Digest, 2005 IEEE MTT-S International, June 2005) have shown that the linearity of semiconductor varactor diode circuits can be improved with the circuit topology shown generally as 400 of FIG. 4. However, their analysis is restricted to semiconductor junction varactors where a power law defines the C(V) curve. Buisman teaches that for a given exponent n in the power law formula, there exists a ratio of capacitor values ($C_1/C_2$) which will eliminate distortion caused by the varactor network.

Figure 4:
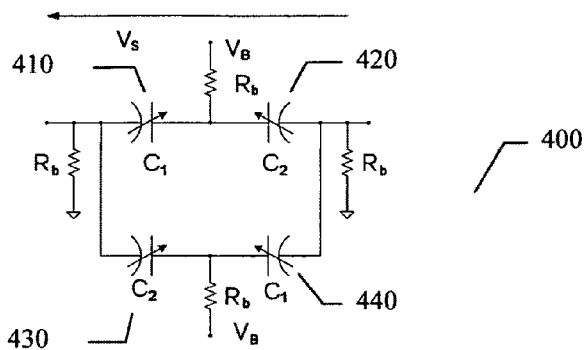
FIG. 4 depicts anti series/anti parallel VVCs of an embodiment of the present invention.

Embodiments of the present invention may use the circuit topology of FIG. 4 as building blocks (unit cells) for circuits implementing VVCs, including devices other than varactor diodes, with different CV curves. Examples shown herein describe VVCs made from thin film dielectric materials, namely ferroelectric films, although the present invention is not limited in this respect. The C(V) curve for ferroelectric thin film VVCs is well approximated by a series of hyperbolic trigonometric functions. An important result of this invention is that a range of $C_1/C_2$ ratios exists in which significant improvements in linearity are possible. There is not just one specific ratio of $C_1/C_2$ that results in dramatic improvements in linearity as taught by Buisman et. al.

Figure 5:
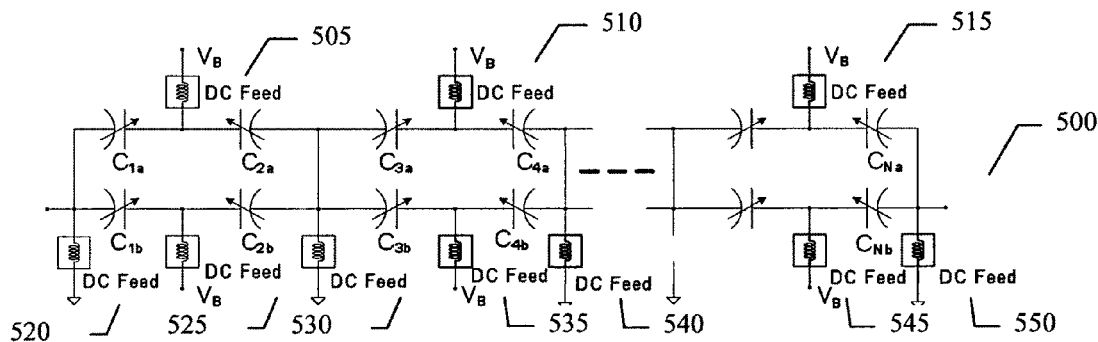
FIGS. 5 and 5B illustrates the topology of low distortion VVC circuits of embodiments of the present invention.

In embodiments of the present invention, but not limited in this respect, the unit cell may be a network of four VVCs 410, 420, 430 and 440 as illustrated generally as 400 of FIG. 4. The capacitors are connected as an anti-series/anti-parallel (AS/AP) network which will be used as a building block. In some embodiments of the present invention, one or more such blocks are cascaded in series to create circuits with reduced distortion. The general topology is shown in FIG. 5 at 500, where DC feeds 505, 510, 515, 520, 525, 530, 535, 540, 545 and 550 replace the high value resistances of FIG. 4. These DC feeds offer very high impedance relative to the capacitive reactance of any VVC in the network. In a more general form, a unit cell is an AS/AP network of capacitors as shown in FIG. 4, but biased with DC feeds, which might be resistors or inductors, replacing the resistors of FIG. 4.

Figure 5B:
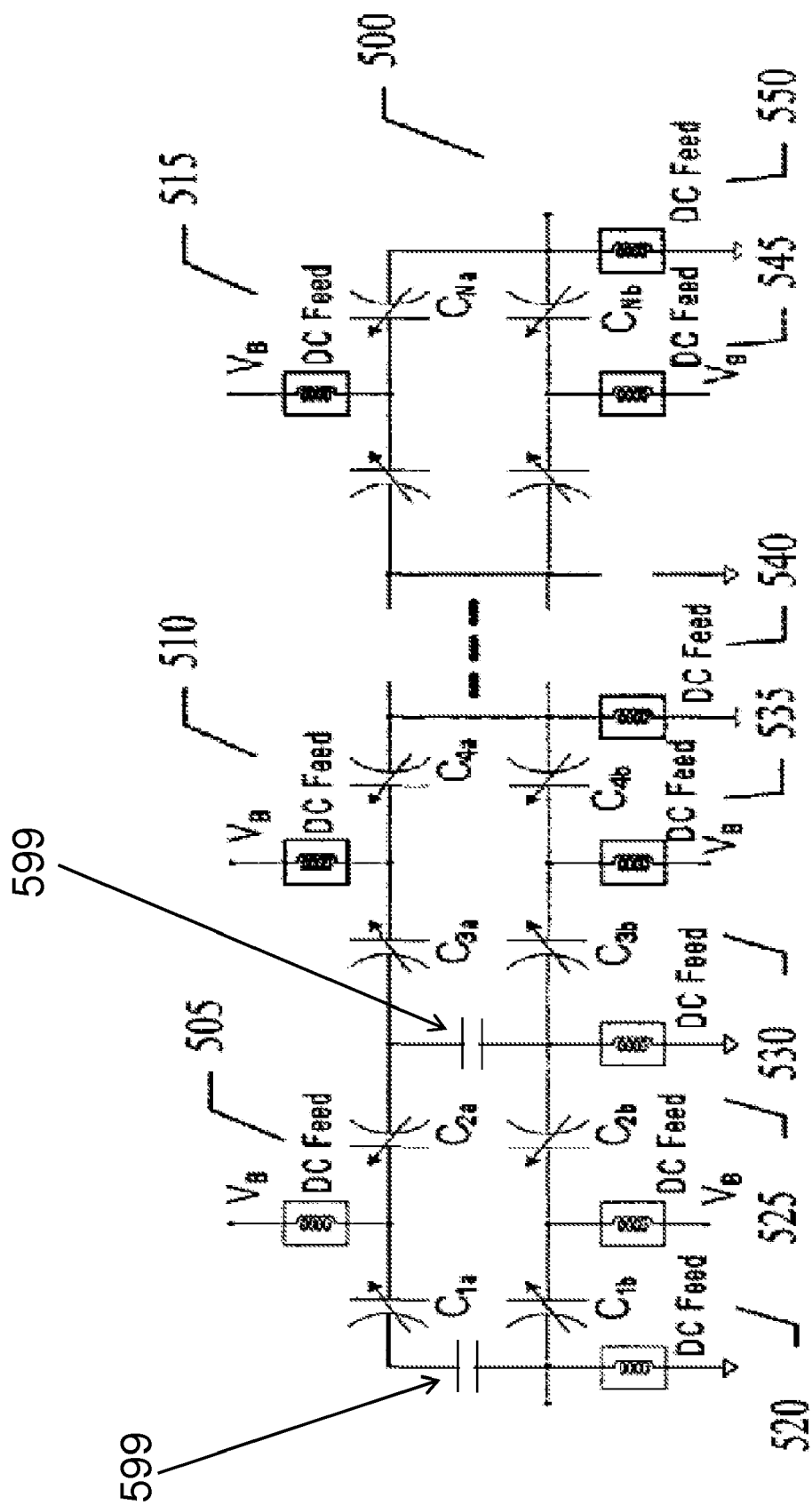
Figure 27:
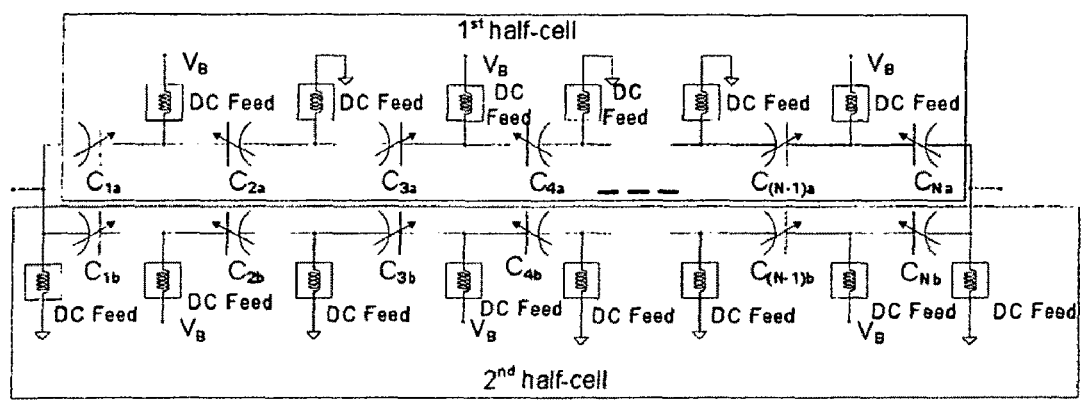
FIG. 27 illustrates a cell including a first half cell and a second half cell of an embodiment of the present invention.

In FIG. 5 there are connections from C.sub.2a to C.sub.2b, C.sub.4a to C.sub.4b, etc., whose purpose is to allow the sharing of the DC feeds providing DC grounds for the bias voltages. Because the signal voltage differences across these connections are always 0V, they do not affect the signal voltages. An alternate embodiment is shown in FIG. 27. This could also serve as the unit cell (the most general form), but, as we shall show later, linearity performance is best when we limit each cell to just four VVCs. FIG. 5B illustrates a topology that utilizes non-variable capacitors 599 with the variable capacitors.

Figure 6:
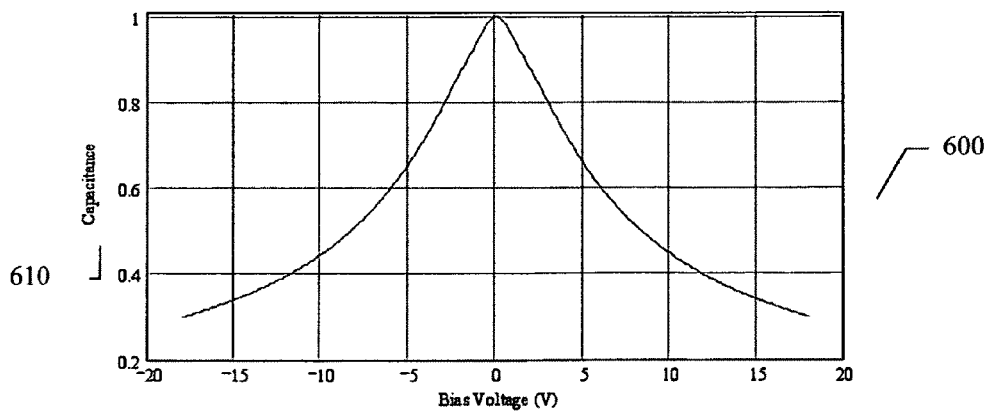
FIG. 6 illustrates a typical capacitance vs. voltage relationship (normalized to 1 at 0V) of an embodiment of the present invention.

FIG. 6 at 600 shows the typical shape of a normalized capacitance 610 vs. voltage 620 curve of a voltage tunable dielectric varactor, such as Paratek® voltage tunable dielectric capacitors (PTICs). The VVCs in FIG. 5 all have the same curve shape. This means that, while the absolute value of the capacitance of each VVC may vary, the ratio of the VVC capacitance with a voltage V applied to the VVC capacitance with no voltage applied is the same for each VVC for any given voltage V. In other words, the CV curve of any VVC can be attained by multiplication of the capacitance values in FIG. 6 with a constant. This is a constraint that highlights the present invention's utility; if the relative shapes of the CV curves could be varied, this would increase the degrees of freedom, and it would become less difficult to obtain better performance.

Key to distortion reduction is selection of the capacitor values $C_{1a}, C_{1b}, C_{2a}, C_{2b}$, etc. Herein it is shown that, for best even harmonic distortion performance, it is necessary that we have only two different VVC values in one unit cell. In each unit cell we have an anti-series pair in which the VVC with the same bias voltage orientation as the signal voltage assumes one capacitance ($C_1$) and the other VVC another capacitance ($C_2$), while in the other anti-series pair this is reversed; the VVC with the same bias voltage orientation as the signal voltage assumes the capacitance $C_2$, the other $C_1$. This feature can be seen in FIG. 4.

It is further shown that the best performance is attained for designs where all VVC values in FIG. 5 assume only one of two values so that all unit cells are identical. Thus, in FIG. 5 we would make $C_{1a}=C_{2b}$ and $C_{1b}=C_{2a}$, $C_{3a}=C_{4b}$ and $C_{3b}=C_{4a}$, and so on, and we also make $C_{1a}=C_{3a}=C_{5a}$, and $C_{1b}=C_{3b}=C_{5b}$, and so on.

Figure 2:
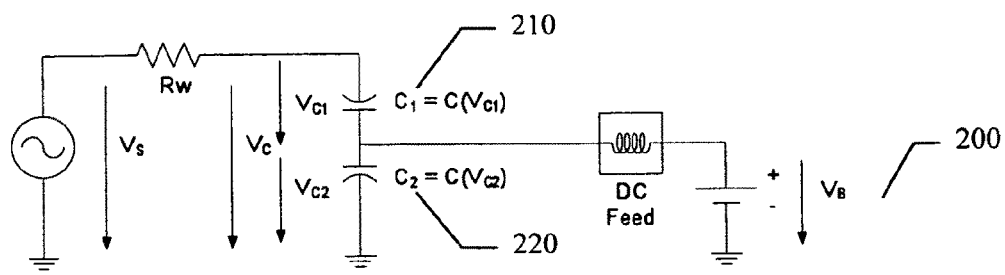
FIG. 2 illustrates a prior art topology with Reduced Harmonic Distortion.
Figure 7:
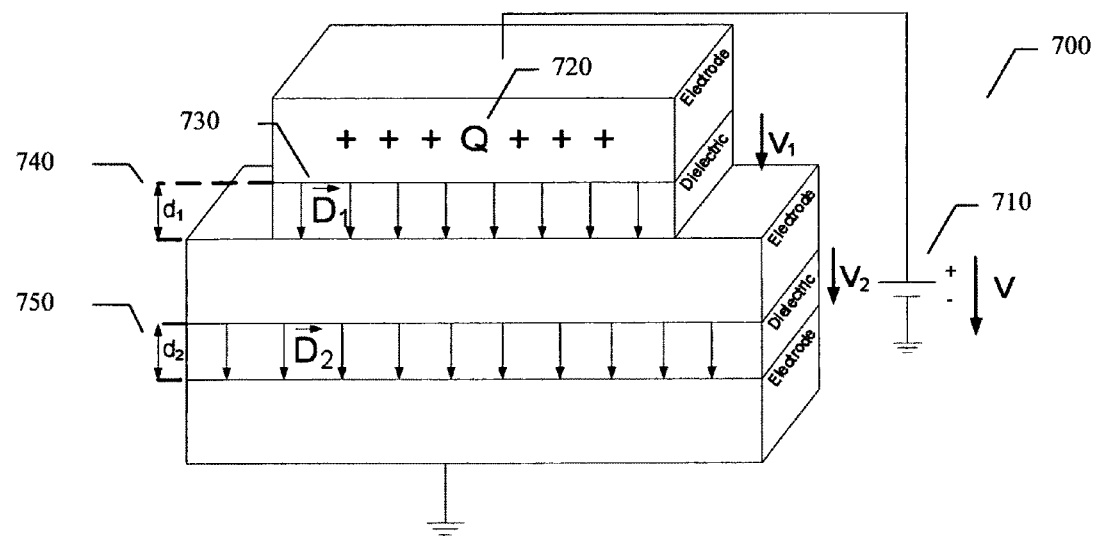
FIG. 7 illustrates a physical representation of two capacitors in series.

First we will analyze how the capacitance of an anti-series pair of VVCs as shown in FIG. 2 varies as a function of applied signal voltage. FIG. 7 at 700 illustrates a physical representation of a stacked capacitor (two capacitors in series). A voltage source 710 is applied to the stacked capacitor, forcing a charge onto the top electrode. This results in an electric displacement field D 730, most of which is inside the dielectrics. The charge Q 720 can be computed with Gauss' law of electricity as $$Q = \oint\!\!\!\oint D \cdot dA$$

where A is the area of the closed surface surrounding Q 720. We assume, however, that, as in any practical capacitor, the dielectric thicknesses $d_1$ 740 and $d_2$ 750 are much smaller than the horizontal dimensions of the capacitor so that most of the displacement field passes through the dielectrics between the electrodes. We can then approximate the charge as $$Q = D \cdot A$$

where A is now the area of a dielectric. The total flux through both electrode pairs must be the same, so, for the two capacitors in series $$Q = D_1 \cdot A_1 = D_2 \cdot A_2 \qquad (2)$$

For a fixed dielectric the electric displacement is related to the electric field E as $$D = \epsilon_0 \cdot \epsilon_r \cdot E$$

where $\epsilon_0$ is the electric field constant and $\epsilon_r$ is the permittivity of the dielectric. However, we have a permittivity $\epsilon_r(E)$ that is a function of the applied E-field, so this becomes $$D(E) = \varepsilon_0 \cdot \int_0^E \varepsilon_r(E)\,dE$$

With a given dielectric thickness d we can express displacement as a function of voltage V by substituting $$E = \frac{V}{d}$$

and obtain a function $\epsilon_r(V)$. Then the displacement is $$D(V) = \frac{\varepsilon_0}{d} \cdot \int_0^V \varepsilon_r(v)\,dv$$

Substituting in (2) we get $$Q = \frac{\varepsilon_0}{d_1} \cdot A_1 \cdot \int_0^{V_1} \varepsilon_r(v)\,dv = \frac{\varepsilon_0}{d_2} \cdot A_2 \cdot \int_0^{V_2} \varepsilon_r(v)\,dv \qquad (3)$$

where $A_1$ and $A_2$ are the surface areas of and $V_1$ and $V_2$ are the voltages over the top and bottom capacitors respectively. The capacitance is defined as $$C = \frac{dQ(V)}{dV} = CV(V, C0\,V)$$

where CV(V, C0V) is the CV function defining the capacitance as a function of the 0V capacitance C0V and the applied voltage V. We can write (3) as $$Q = \int_0^{V_1} CV(v, C_0)\,dv = \int_0^{V_2} CV(v, C_1)\,dv \qquad (4)$$

where $C_1$ and $C_2$ are the 0V capacitances of the top and bottom capacitors. Because the total voltage V over the capacitors is $$V = V_1 + V_2 \quad (5)$$

it is in principle possible to compute $V_1$ and $V_2$ as a function of total applied voltage V by solving (5) for $V_1$ or $V_2$, substituting (5) in (4) and solving for the remaining variable $V_2$ or $V_1$. This can always be done numerically. A closed expression may or may not be possible depending on the complexity of the CV curve equation.

From this analysis we see that, for a given charge on two or more VVCs in series, the voltage across each VVC, and thereby the total voltage across the circuit, is uniquely defined. Because the voltages in (5) are dependent on Q, we can write $$V(Q) = V_1(Q) + V_2(Q) \quad (5a)$$

from which it follows that the derivatives can be added as well, i.e., $$\frac{dV}{dQ} = \frac{dV_1}{dQ} + \frac{dV_2}{dQ} \quad (6)$$

Figure 8:
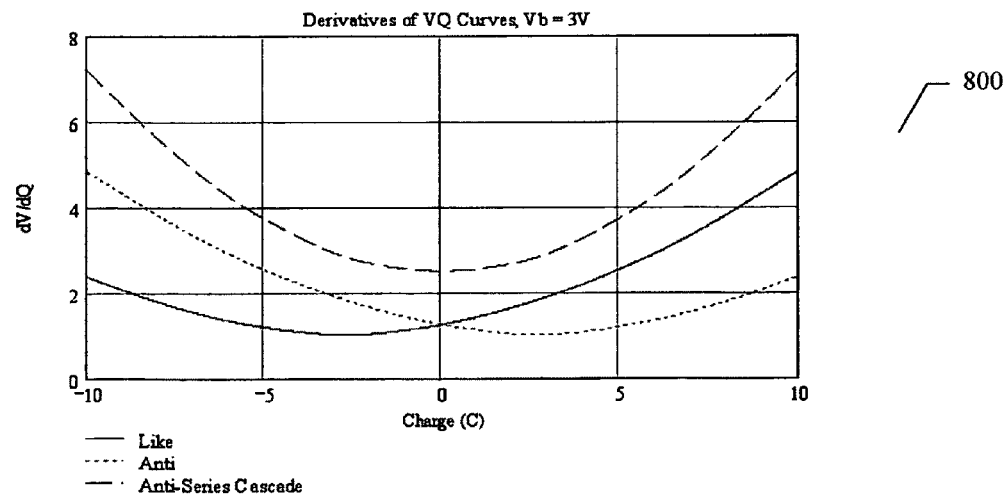
FIG. 8 illustrates derivative of AC Voltage vs. Charge on anti series VVCs, equal values of an embodiment of the present invention.

Given the CV curve of a VVC, we can compute its dV/dQ curve, which defines the VVC equally well. We are seeking to make the entire VVC network as independent of the signal voltage as possible. Mathematically we seek to make the capacitance C(V)=dQ/dV as constant as possible, which means that dV/dQ must be as constant as possible as well. FIG. 8 at 800 shows how the dV/dQs of two equal anti-series VVCs add together.

Figure 9:
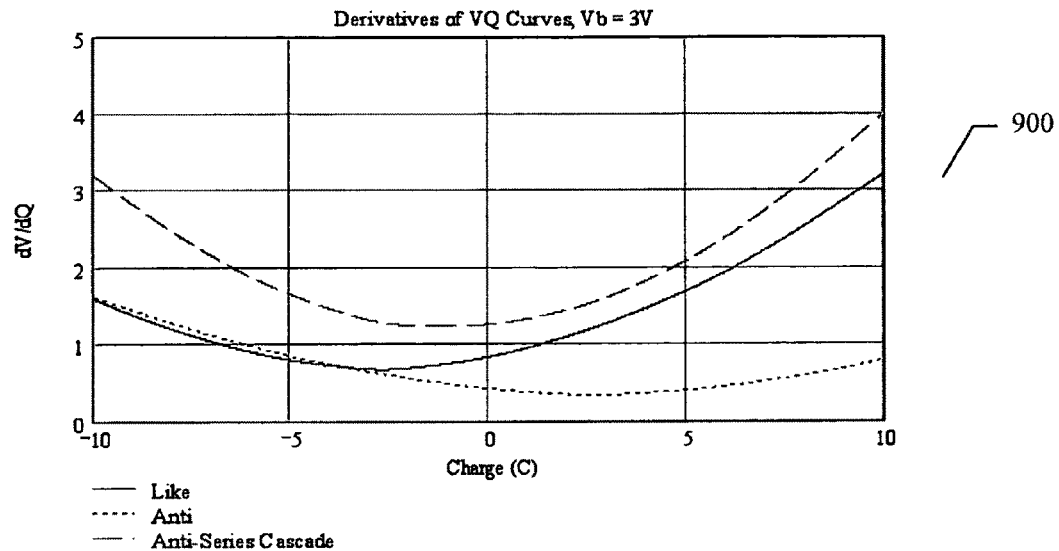
FIG. 9 illustrates derivative of AC Voltage vs. Charge on Anti Series VVCs, Unequal Values, VB=3V of an embodiment of the present invention.

We note that, for 2 anti-series VVCs with any CV curve, the dV/dQ curve is symmetric if their values are equal. If they are not equal, then the curve is not symmetric. FIG. 9 at 900 shows an example where they are not equal, specifically, where $C_1 = 2 \times C_2$.

A dV/dQ curve that is asymmetric around the y-axis, which means an asymmetric CV curve as well, is undesirable because it will result in even-order harmonics ($2^{nd}$, $4^{th}$, $6^{th}$, etc.) and is thus to be avoided as discussed below. This is why anti-series VVC networks generally pair a series VVC with an anti-series VVC of the same value.

Figure 10:
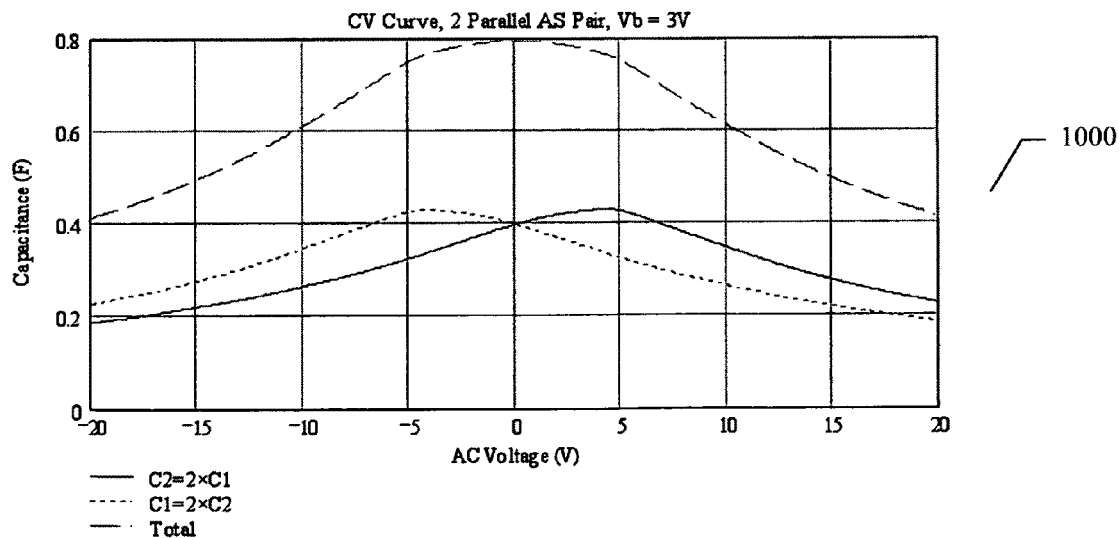
FIG. 10 illustrates Capacitance vs. Voltage on 2 Anti Parallel, Anti Series VVCs per FIG. 4, VB=3V of an embodiment of the present invention.

If, however, an anti-series pair is anti-parallel to another anti-series pair (as shown in FIG. 4), symmetry can be attained even with unequal anti-series VVCs, provided that $C_1$ is in anti-series in one parallel path and in series in the other path with $C_2$ being just the opposite. To see why, consider FIG. 10, which shows at 1000 the capacitance vs. voltage curves of the individual anti-series pairs and the total CV of a circuit per FIG. 4. As can be seen, the individual curves are mirror images of each other around the y-axis (signal voltage=0). Like any two parallel capacitances, the anti-parallel pair of anti-series VVCs can be added directly, which results in a symmetric CV curve.

Figure 11:
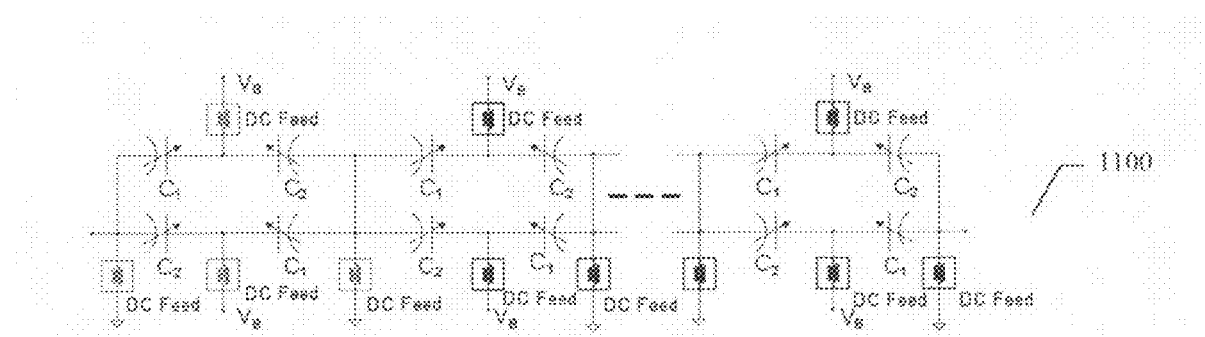
FIG. 11 shows a circuit with capacitor configuration of an embodiment of the present invention.

Having established that a unit cell works best with just two different VVC capacitances, we now consider the best combinations of VVC capacitances across unit cells. In general we seek to obtain equal voltages across all unit cells of the circuit in FIG. 5. If they are not equal, then some cells will distort more than others. For some specific CV curves this may help, but in general the lowest overall distortion is attained when the voltages across each unit cell are equal as illustrated in greater detail below. Therefore, the invention works best when implemented with capacitors as shown in FIG. 11 at 1100.

We have now established that we need only two different VVC values, so we now look at selecting these for best performance. With only two VVC values there is only one degree of freedom to attain a desired capacitance. We must select a metric for linear performance. We will make our metric a function of desired capacitance rather than bias voltage. There are many possible metrics, one of which might be to minimize the squares of the differences of the total capacitance with a signal voltage $V_S$ applied and the total capacitance with no signal voltage. We might seek to minimize the error function $$Err(V_S, V_B, C_1) = [Ctot(0V, V_B, C_1) - Ctot(V_S, V_B, C_1)]^2 \quad (16a)$$

where Ctot is the capacitance of the VVC network as a function of the signal voltage $V_S$, the bias voltage $V_B$ and the selected VVC value of $C_1$. An alternate error function might be $$Err(V_S, V_B, C_1) = \log[[Ctot(0V, V_B, C_1) - Ctot(V_S, V_B, C_1)]^2] \quad (16b)$$

It is not necessary to specify $C_2$ as this will follow from the nominal desired capacitance $C_d$ and the selected VVC value $C_1$ as $$C_2(C_d, C_1) = \frac{1}{\frac{2}{Nu \cdot C_d} - \frac{1}{C_1}}$$

where Nu is the number of unit cells in series. We seek to optimize linearity over a number of bias voltages. Let VB be a vector of M elements, indexed from 0 to M−1, containing all bias voltages of interest. Let W be a vector of M elements, indexed 0 to M−1, containing relative weightings, that is, the relative importance of the linearity performance at the bias voltages VB. Then we can define the swept error function as $$ErrSw(C_1) = \sum_{i=0}^{M-1} Err(V_{Err}, VB_i, C_1) \cdot W_i \quad (17)$$

where $V_{Err}$ is the maximum signal voltage of interest and $Err(V_{Err}, VB_i, C_1)$ is an error function such equation (16a) or (16b) above.

We now seek the value of $C_1$ that minimizes (17). This is a classic one-variable minimization problem and there are many ways to attack this such as finding the null of the partial derivative $$\frac{dErrSw(C_1)}{dC_1},$$

or various numeric minimization algorithms such as Brent's method, annealing methods, etc.

Figure 12:
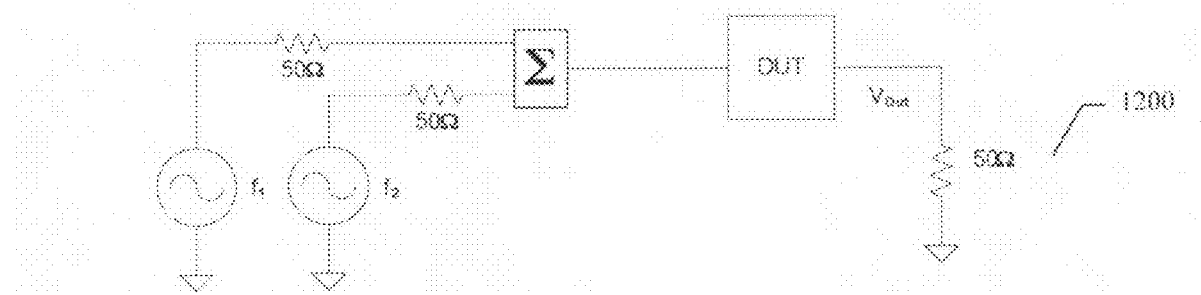
FIG. 12 depicts the IP3 Test Configuration of an embodiment of the present invention.
Figure 13:
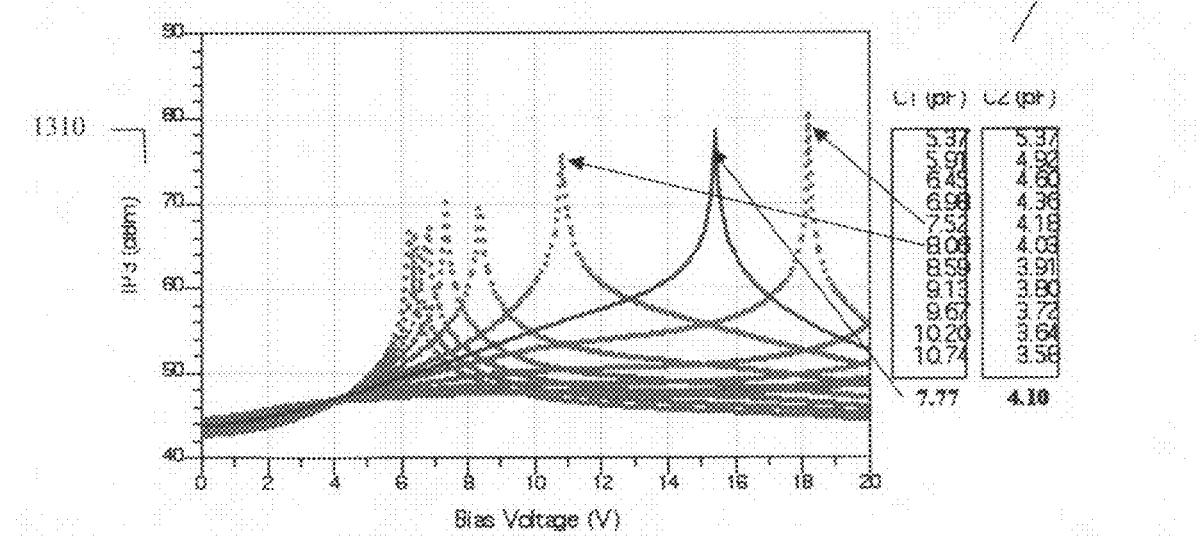
FIG. 13 graphically depicts the 3rd Intercept Point vs. Bias Voltage Simulations, Various C1 and C2 Values of an embodiment of the present invention.

A simpler method is to compute or simulate the linearity performance metric of interest with a number of different values of $C_1$ and select the value that gives the preferred response. FIG. 12 at 1200 shows a simulation configuration to determine the $3^{rd}$ order intercept point ($IP_3$). The device under test (DUT) is a circuit of VVCs as shown in FIG. 11. It is connected to two tone generators with 50Ω source impedances, and to a 50Ω termination resistor. The generators pass tones at the frequencies $f_1$ and $f_2$ into the DUT. Our linearity measure is the $3^{rd}$ order mixing product created at the frequency $f_{IM}=2\times f_2-f_1$ that is contained in the voltage $V_{Out}$. The key simulation parameters are (although the present invention is not limited in this respect):
Capacitance at 0V: 5.37 pF
Tone Levels: 25 dBm/Tone into a 50Ω load
Test Frequencies:
  $f_1$: 824 MHz
  $f_2$: 846.5 MHz
  $f_{IM}$: 869 MHz FIG. 13 at 1300 shows simulation results of $IP_3$ 1310 vs. bias voltage 1320 of a network per FIG. 4 with one unit cell for $C_1$ values from 5.37 to 10.74 pF. The best overall $C_1$ value, found by minimizing the error per equation (17), is 7.77 pF, corresponding to a $C_2$ of 4.10 pF.

Figure 14:
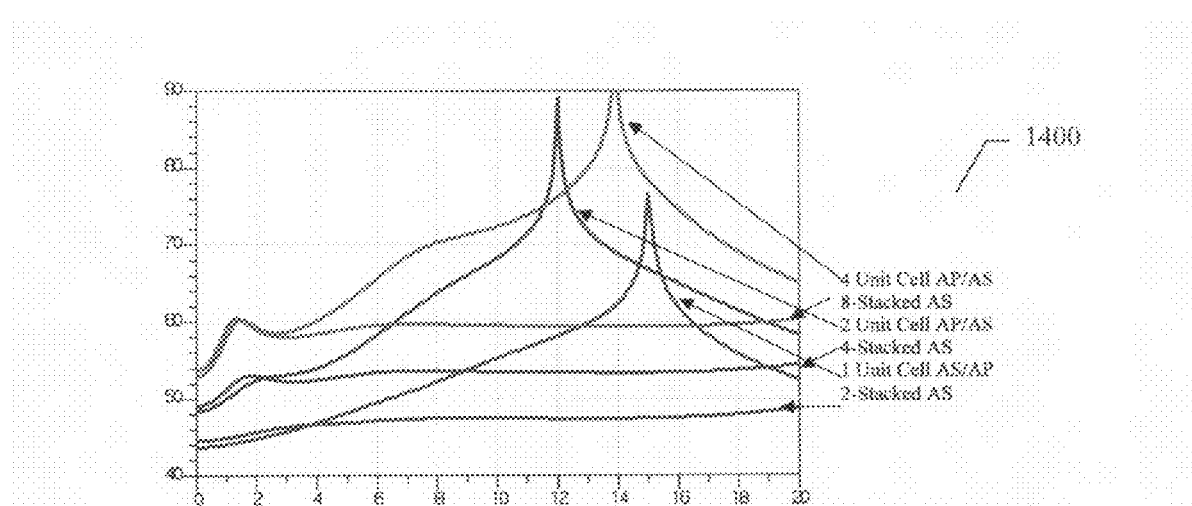
FIG. 14 graphically depicts 3rd Intercept Point vs. Bias Voltage Simulations, Various C1 and C2 Values of an embodiment of the present invention.

To show the relative improvement available with this invention, we compare $IP_3$ simulation results of this invention per FIG. 11 with simple stacked circuits per FIG. 3. This comparison is shown in FIG. 14. Simulations of simple stacked circuits are designated N-stacked AS (anti-series), with N (2, 4, or 8) defining the number of VVCs in the stack in FIG. 3. Simulations of circuits per FIG. 11 are designated Nu Unit Cell AS/AP, with Nu (1, 2 or 4) denoting the number of unit cells in the circuit. The simulation parameters are the same as those used for the simulations in FIG. 13. The VVC values are:

VVC Values, $IP_3$ Simulations (FIG. 14) of Simple Stack (FIG. 3)

| VVCs in Stack | VVC Value ($V_B$ = 0 V) C (pF) |
|---|---|
| 2 | 10.74 |
| 4 | 21.48 |
| 8 | 42.97 |

VVC Values, $IP_3$ Simulations (FIG. 14) of Invention (FIG. 11)

| Unit Cells in Stack | VVC Value ($V_B$ = 0 V) | |
|---|---|---|
| | $C_1$ (pF) | $C_2$ (pF) |
| 1 | 4.10 | 7.77 |
| 2 | 8.20 | 15.59 |
| 4 | 16.47 | 30.88 |

The simulation in FIG. 14 is intended to demonstrate the potential $IP_3$ improvement attainable with the concept of this invention and uses ideal DC feeds. In practice the DC feeds must be implemented as real circuits. The simplest way is to use networks of resistors Rb whose values are significantly greater than the magnitude of the reactive impedance of the VVCs at the operating frequency (i.e., Rb>>1/(ω·C), but also significantly less than the leakage resistance of the VVCs. This ensures that the VVCs are biased as desired while the bias resistors Rb only minimally affect the signal voltage.

Many different bias resistor network topologies are possible that will result in very good linear distortion performance. However, a good VVC network must also exhibit a good quality factor (Q) and a short charge time (critical for setting the desired operating capacitance of the VVC). The value of this invention manifests itself in these parameters.

Theoretically it is possible make the linearity of a VVC circuit as good as desired by stacking as many VVCs as needed in a circuit such as that in FIG. 3. However, as discussed earlier, increasing the stack also results in a greater total capacitance that must be charged ($N^2\times$the desired capacitance), which results in greater time to tune to a desired capacitance and greater current that must be provided by the bias source of $V_B$. The charge time can be reduced by lowering the value of the resistors Rb, but doing so will degrade the Q of the circuit. However, employing the principles of this invention, it is possible to design networks with Q, charge time, and total capacitance comparable to that of a network per FIG. 3 but with significantly better linearity than said network. Alternately, it is possible for embodiments of the present invention to provide design networks with similar linearity but better Q, charge time and/or total capacitance. Three such networks are shown in FIGS. 15, 16 and 17 at 1500, 1600 and 1700 respectively.

Figure 15:
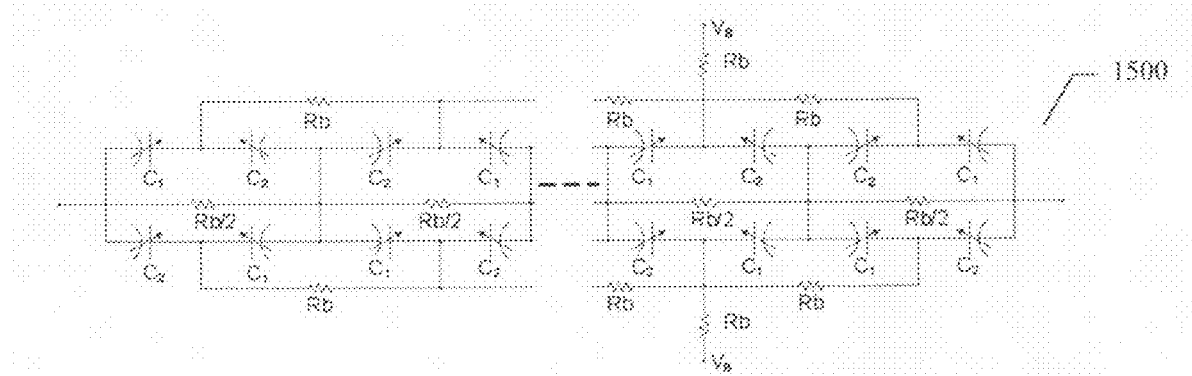
FIGS. 15, 16 and 17 provide three distinct circuits of embodiments of the present invention that illustrate the dynamic behavior of the VVC networks by simulating a step of 18V applied to the bias voltage port $V_B$ in an embodiment of the present invention.
Figure 17:
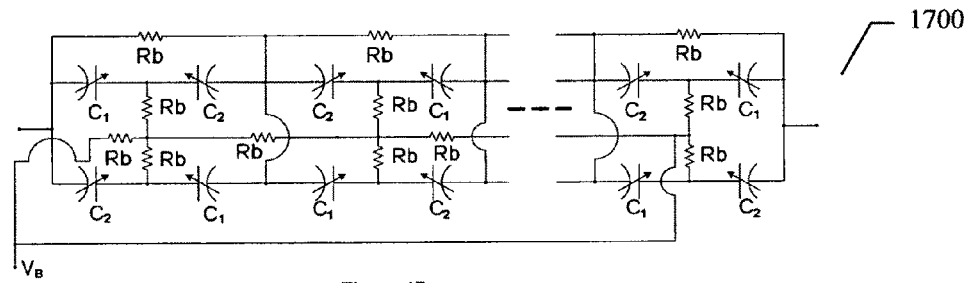
Figure 18:
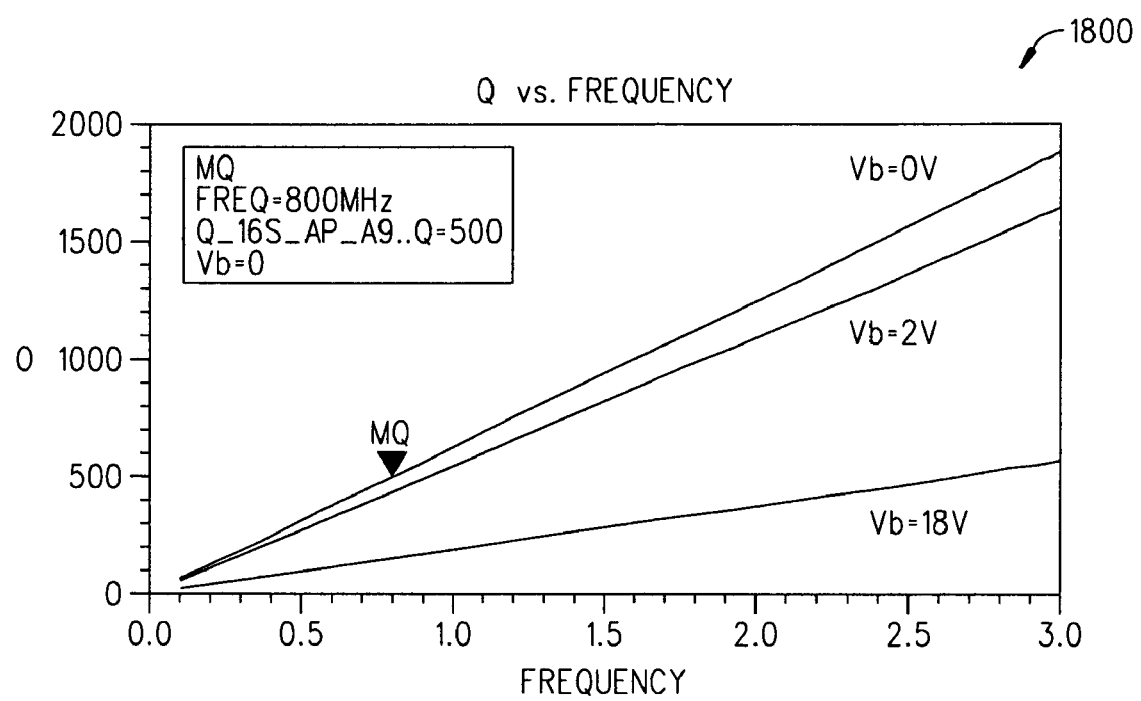
FIG. 18 graphically shows the Q of all devices evaluated with bias voltages of 0, 2 and 18V applied in those embodiments of the present invention shown in FIGS. 15, 16 and 17 when certain values are selected for Rb.

We compare the performance of several simple N-stacked networks per FIG. 3 with networks per the invention shown in FIG. 4 (1 unit cell only) and FIG. 15, FIG. 17 and FIG. 18, each consisting of ½×N unit cells. In each network we select the bias resistor values so that the resulting Q of each network, at 800 MHz and with a bias voltage of 0V applied, is 500. FIG. 18 at 1800 shows the Q of all devices evaluated with bias voltages of 0, 2 and 18V applied. The VVC and bias resistor values are shown below

Figure 16:
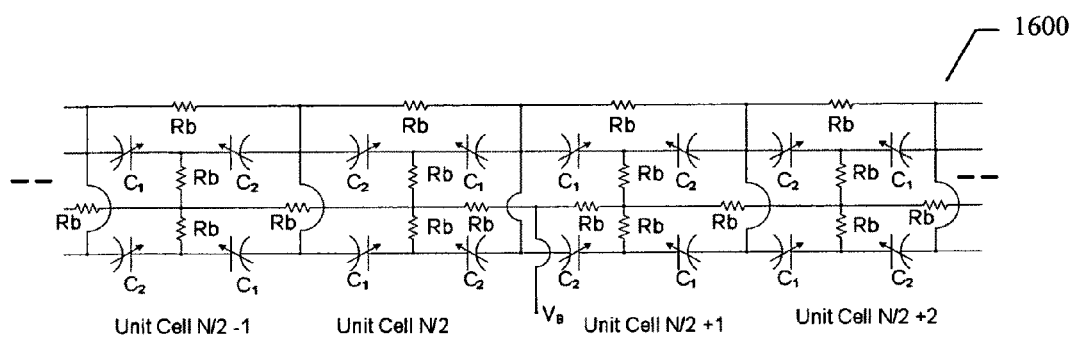

| | Simple Stacked VVCs in Stack | | | Per Invention Unit Cells in Stack | | |
|---|---|---|---|---|---|---|
| | 2 | 4 | 8 | 1 | 2 | 4 |
| VVC Values (pF) | 10.74 | 21.48 | 42.97 | | | |
| $C_1$ | | | | 4.10 | 8.20 | 16.47 |
| $C_2$ | | | | 7.77 | 15.59 | 30.88 |
| Total Capacitance Charged (pF) | 21.48 | 85.92 | 343.76 | 23.74 | 95.16 | 378.80 |
| Bias Resistor (kΩ) | 4.63 | 24.31 | 10.71 | | | |
| FIG. 4 | | | | 10.15 20.00* | | |
| FIG. 15 | | | | | 49.72 | 22.11 |
| FIG. 16 | | | | | 17.42 | 13.68 |
| FIG. 17 | | | | | 22.05 | 21.60 |

*20K bias resistor results in Q of 985 at 800 MHz with bias voltage = 0 V.

Figure 19:
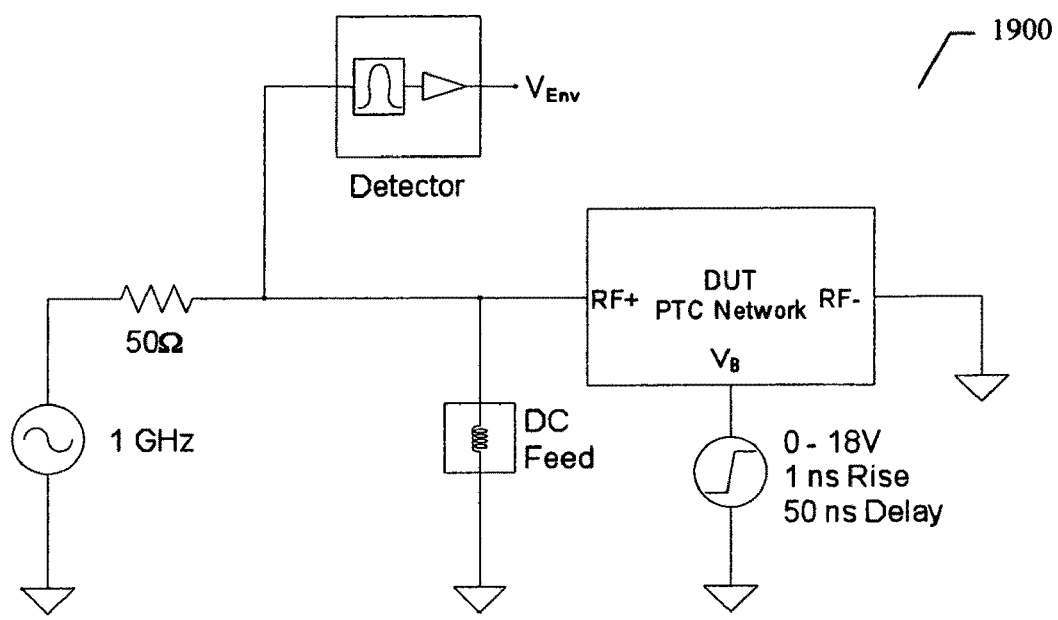
FIG. 19 provides a circuit that illustrates the dynamic behavior of the VVC networks of embodiments of the present invention.

We show the dynamic behavior of the VVC networks by simulating a step of 18V applied to the bias voltage port $V_B$ in FIG. 4, FIG. 15, FIG. 16 and FIG. 17 while one signal terminal is connected to ground and the other signal terminal is connected to a signal generator that passes a 1 GHz sinusoidal signal through a 50Ω resistor, and measuring the envelope of the signal. This is shown in FIG. 19 at 1900. As the VVCs charge, their capacitances decreases and so the magnitude of the signal at the RF+ terminal of the DUT increases. Based on this effect we compare the step responses of the networks per the invention with that of simple stacked networks.

Figure 20:
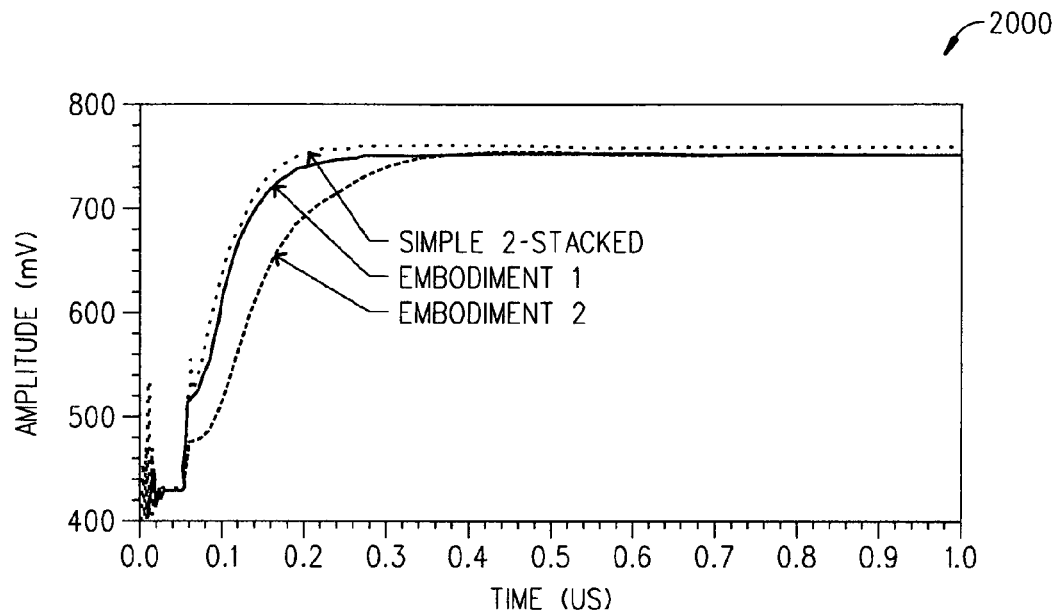
FIG. 20 graphically shows the result of a circuit consisting of two anti-series VVCs with a bias resistor that illustrates almost the same step response as an anti-series circuit of an embodiment of the present invention.
Figure 23:
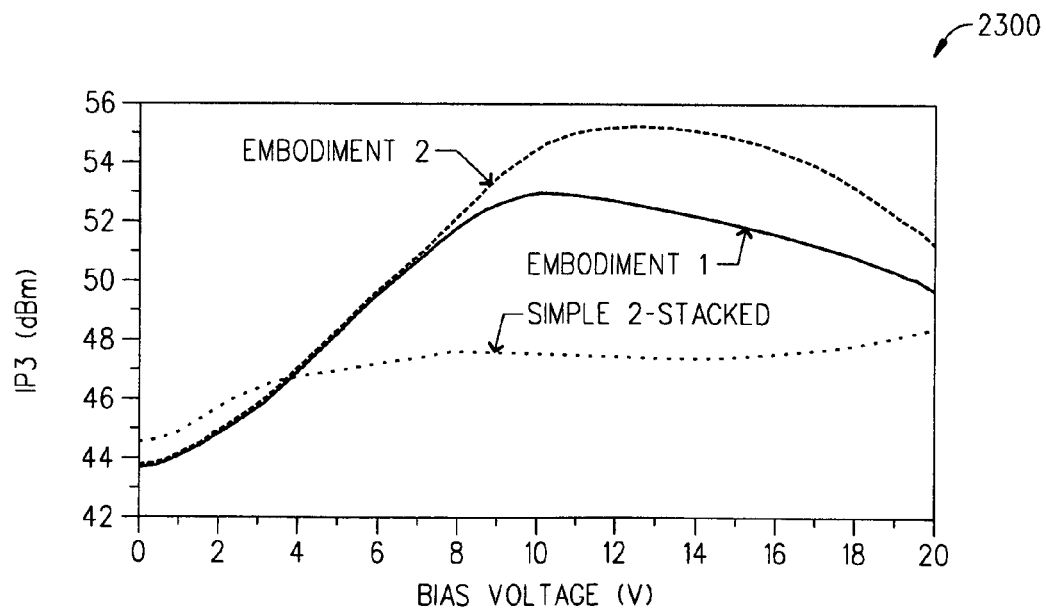
FIGS. 23-25 graphically illustrate the $3^{rd}$ intercept point vs bias voltage responses for various embodiments of the present invention.

For a single unit cell there are not many options for connecting bias resistors. We compare a circuit per FIG. 4 with a circuit consisting of two anti-series VVCs as in FIG. 2. Embodiment 1, with a bias resistor of 10kΩ, has almost the same step response as the anti-series circuit (see FIG. 20 at 2000). A look at FIG. 23 at 2300 shows a modest improvement in $IP_3$ of the circuit per FIG. 4 as compared to the anti-series circuit in FIG. 2. The cause for why the improvement is not greater is the impact of the bias resistors on the signal voltage. When we increase the bias resistor value to 20 kΩ (Embodiment 2), the $IP_3$ improves by 7-8 dB at some bias voltage ranges.

Figure 21:
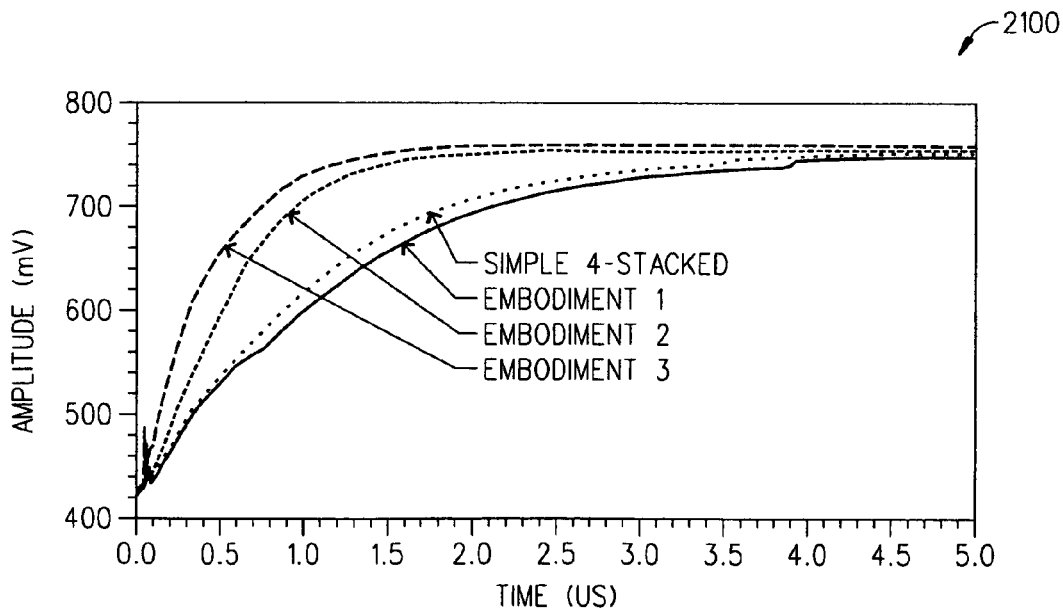
FIG. 21 graphically illustrates the response times for two unit-cell circuits in an embodiment of the present invention.
Figure 24:
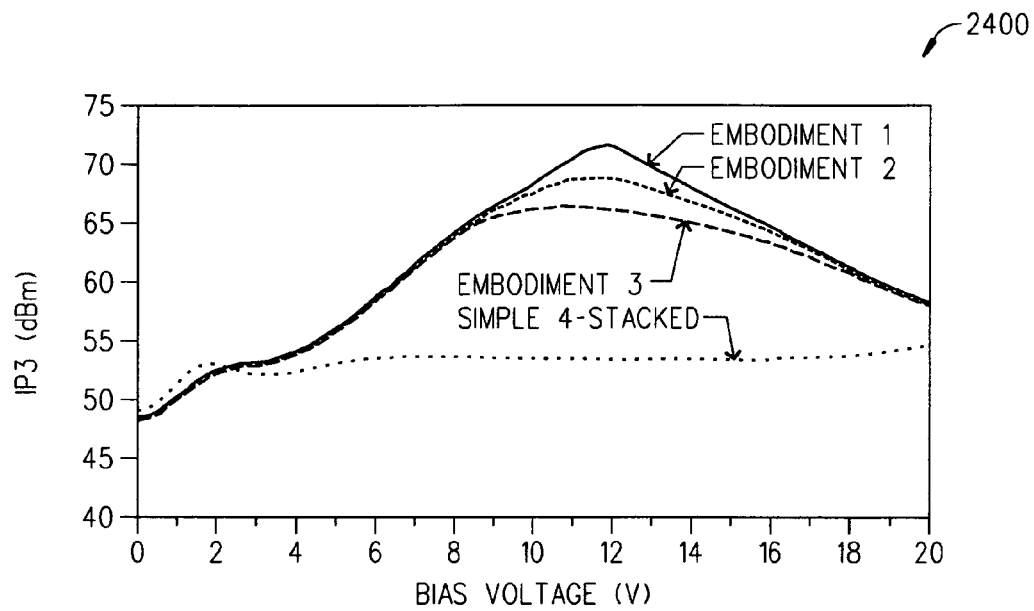

For circuits using two or more unit cells, many different bias resistor networks are possible. We simulate the circuits per FIG. 15 (Embodiment 1), FIG. 16 (Embodiment 2), and FIG. 17 (Embodiment 3) for two and four unit cells, and we compare these with circuits consisting of four and eight VVCs in anti-series per FIG. 3. The response times for two unit-cell circuits, shown in FIG. 21 at 2100, of Embodiments 1 and 2 is somewhat longer, and that of Embodiment 3 slightly shorter, than the time of a simple 4-stacked circuit. However, as shown in FIG. 24 at 2400, the $IP_3$ is always better, and for some bias voltages markedly so.

Figure 22:
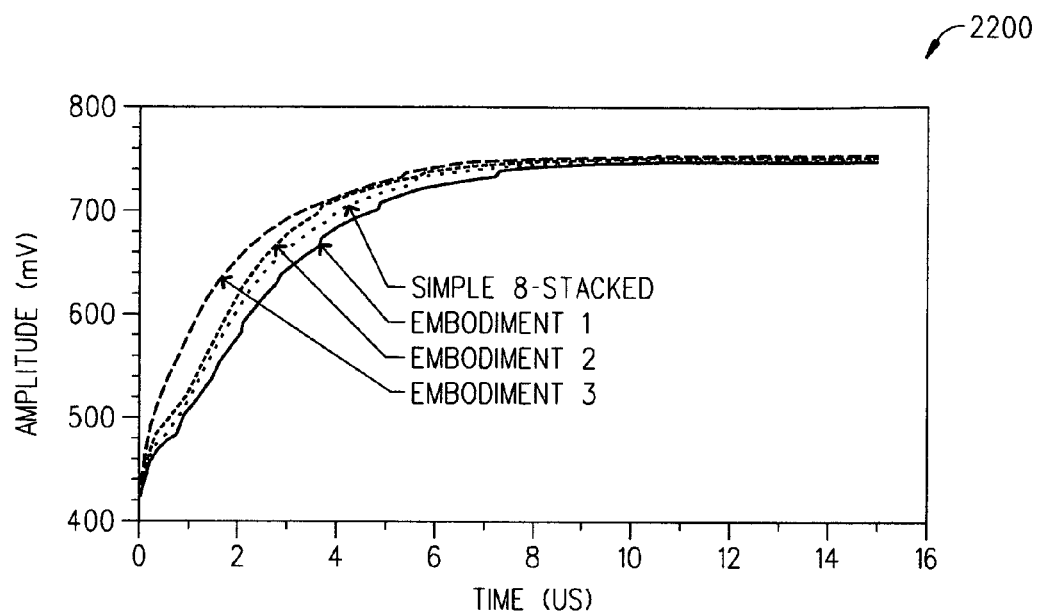
FIG. 22 graphically illustrates the response times for four unit-cell circuits in an embodiment of the present invention.
Figure 25:
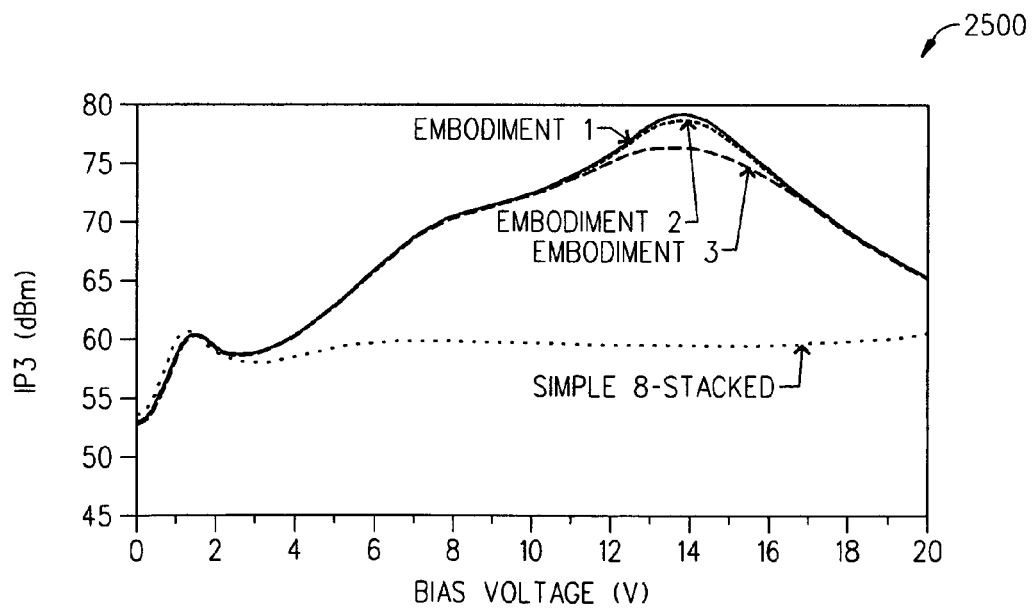
Figure 26:
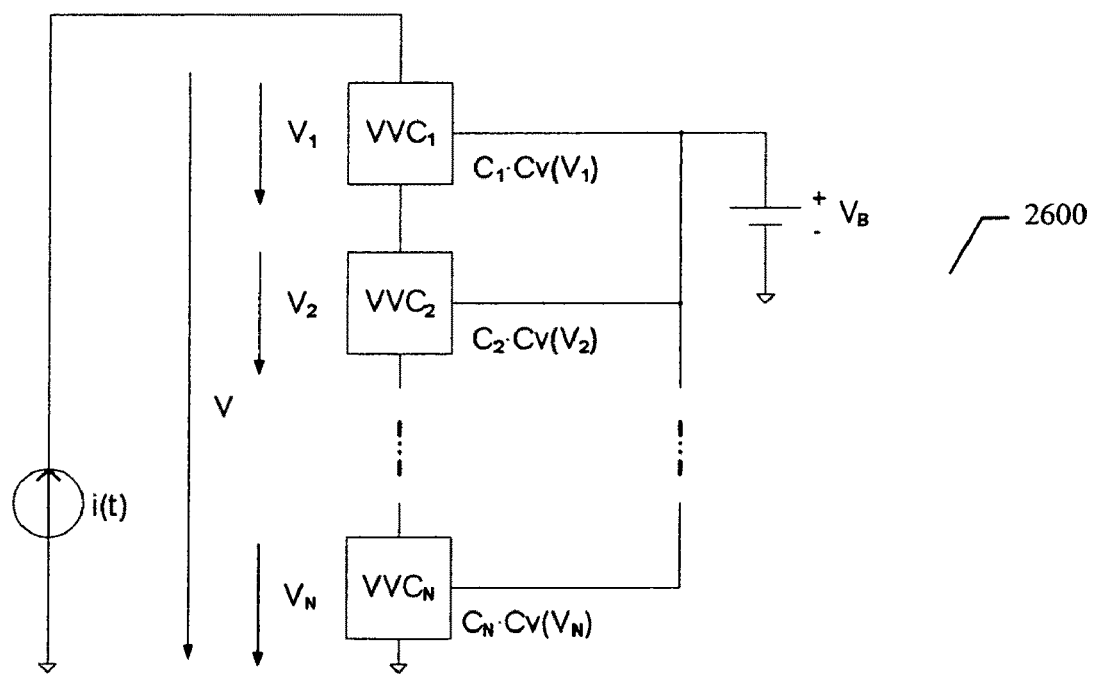
FIG. 26 provides a circuit used to prove that, when stacking several unit cells of this invention, the best linearity performance is attained when all unit cells are equal.

With four and more unit cells, the linearity improvement is even greater. From FIG. 22 at 2200 we see that the step responses for all Embodiments 1, 2 and 3 of the invention are comparable to that of a simple 8-stacked circuit, but, as seen in FIG. 25 at 2500, in some bias voltage ranges the $IP_3$ is much (up to 20 dB) greater. Further, FIG. 26 at 2600 provides a circuit used to prove that, when stacking several unit cells of this invention, the best linearity performance is attained when all unit cells are equal.

Thus, as demonstrated above, embodiments of the present invention provide the construction of significantly more linear VVC networks while performing comparably to other topologies. Conversely, embodiments of the present invention allow the construction of networks with comparable linearity to the other circuit topologies while significantly improving other important specifications such as Q, charge time and total capacitance to be charged.

Figure 28:
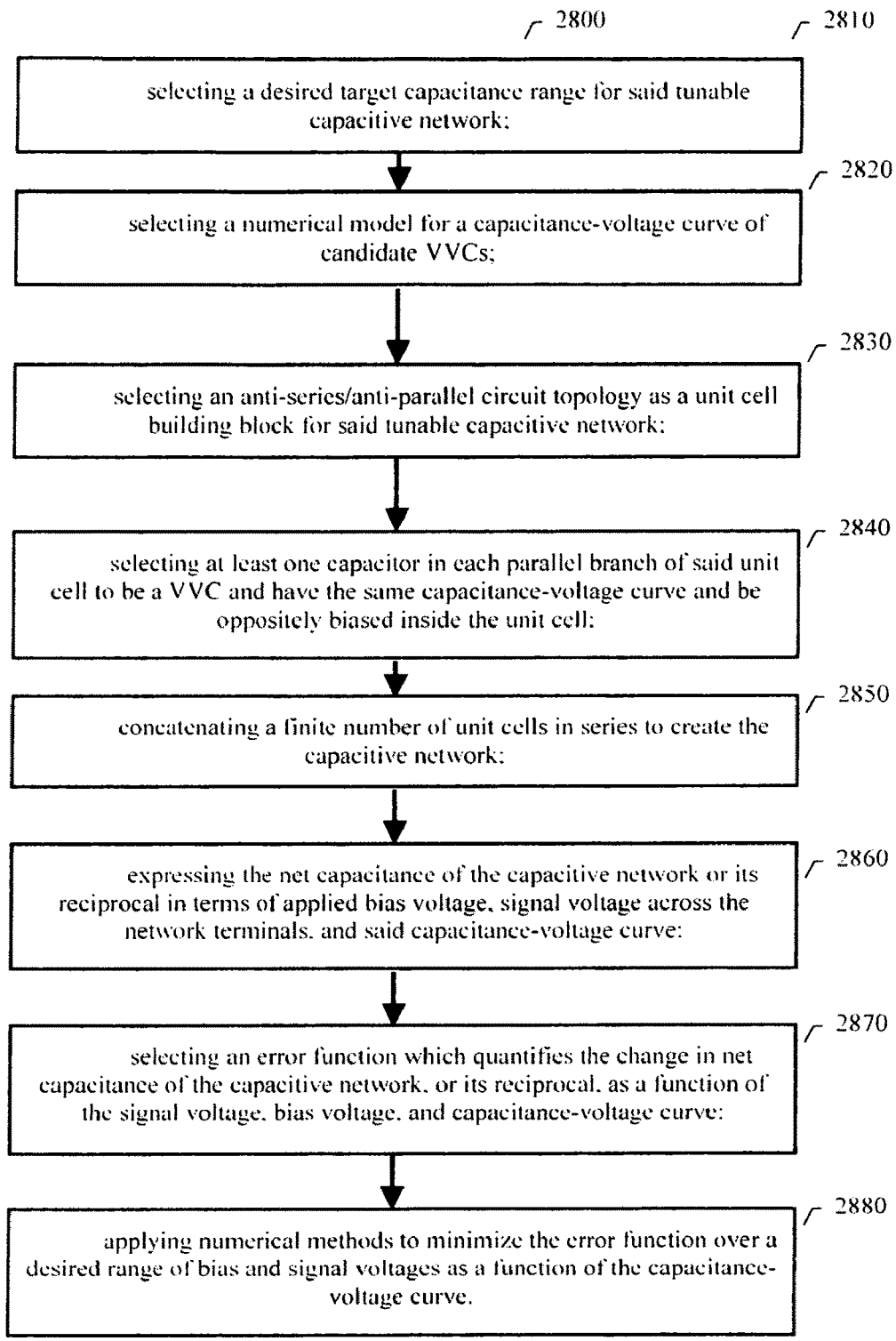
FIG. 28 provides flowchart of a method according to an embodiment of the present invention.

Turning now to FIG. 28 at 2800 is an illustration a method to design linear, tunable, capacitive networks, comprising selecting a desired target capacitance range for said tunable capacitive network 2810; selecting a numerical model for a capacitance-voltage curve of candidate VVCs 2820; selecting an anti-series/anti-parallel circuit topology as a unit cell building block for said tunable capacitive network 2830; selecting at least one capacitor in each parallel branch of said unit cell to be a VVC and have the same capacitance-voltage curve and be oppositely biased inside the unit cell 2840; concatenating a finite number of unit cells in series to create the capacitive network 2850; expressing the net capacitance of the capacitive network or its reciprocal in terms of applied bias voltage, signal voltage across the network terminals, and said capacitance-voltage curve 2860; selecting an error function which quantifies the change in net capacitance of the capacitive network, or its reciprocal, as a function of the signal voltage, bias voltage, and capacitance-voltage curve 2870; and applying numerical methods to minimize the error function over a desired range of bias and signal voltages as a function of the capacitance-voltage curve 2880.

Figure 1:
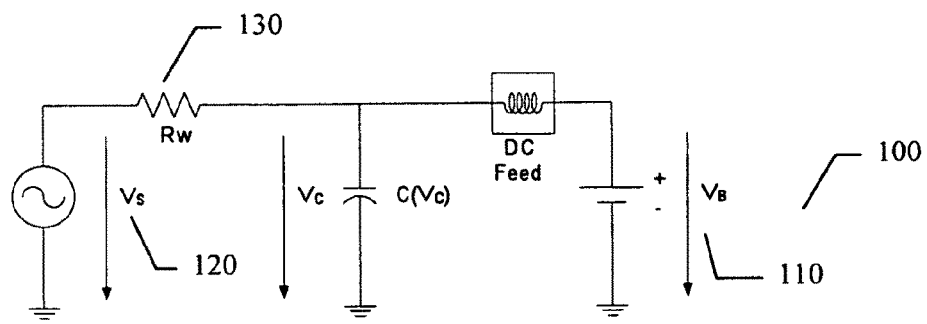
FIG. 1 illustrates a prior art circuit with voltage variable capacitors (VVCs) Generating Harmonics.

To elaborate in greater detail on why a VVC With an Axis-Symmetric CV Curve Suppresses Even-Order Harmonics:
Consider the circuit in FIG. 1. Let a perfectly sinusoidal voltage $$v(t) = U \cdot \sin(\omega \cdot t) \quad (A1)$$

be applied to the VVC. Herein U designates the voltage amplitude, $\omega$ the angular frequency and t the time. The current i through the VVC is then $$i = \frac{dQ}{dt} = \frac{dQ}{dv} \cdot \frac{dv}{dt} = C(v) \cdot \frac{dv}{dt} \quad (A2)$$

where Q is the charge on the VVC and C(v) is the capacitance as a function of the applied voltage, or the CV curve of the VVC. Let C(v) be expressed as the polynomial $$C(v) = C_0 + C_1 \cdot v + C_2 \cdot v^2 + \ldots = \sum_{n=0}^{\infty} C_n \cdot v^n \quad (A3)$$

Substituting A3 in A2 we get the current $$i = \sum_{n=0}^{\infty} C_n \cdot v^n \cdot \frac{dv}{dt} \quad (A4)$$

We compute the derivative of the voltage in A1 over time $$\frac{dv}{dt} = U \cdot \omega \cdot \cos(\omega \cdot t) \quad (A5)$$

and substitute A1 and A5 in A4 and get the current $$i(t) = \sum_{n=0}^{\infty} C_n \cdot U^n \cdot \sin^n(\omega \cdot t) \cdot U \cdot \omega \cdot \cos(\omega \cdot t) \quad (A6)$$

We note the following identities (see http://mathworld.wolfram.com/TrigonometricPowerFormulas.html) for even exponents $$\sin^{2n}(x) = \frac{1}{2^{2n}} \cdot \binom{2n}{n} + \frac{(-1)^n}{2^{2n-1}} \cdot \sum_{k=0}^{n-1} (-1)^k \binom{2n}{k} \cdot \cos[2 \cdot (n-k) \cdot x] \quad (A7a)$$

and for odd exponents $$\sin^{2n+1}(x) = \frac{(-1)^n}{4^n} \cdot \sum_{k=0}^{n} (-1)^k \cdot \binom{2n+1}{k} \cdot \sin[(2 \cdot (n-k) + 1) \cdot x] \quad (A7b)$$

where $$\binom{n}{k}$$

denotes the number of combinations each of size k that can be formed from n objects, or $$\binom{n}{k} = \frac{n!}{(n-k) \cdot k!}$$

! designates the faculty operator, i.e., $n! = 1 \cdot 2 \cdot 3 \cdot \ldots \cdot n$.
We rewrite A7b $$\sin^{2n-1}(x) = \frac{(-1)^{n-1}}{4^{n-1}} \cdot \sum_{k=0}^{n-1} (-1)^k \cdot \binom{2n-1}{k} \cdot \sin[(2 \cdot (n-k) - 1) \cdot x] \quad (A7c)$$

and rewrite A6

$$i(t) = \qquad (A6a)$$
$$U \cdot \omega \cdot C_0 \cdot \cos(\omega \cdot t) + U \cdot \omega \cdot \sum_{n=1}^{\infty} C_{2n} \cdot U^{2n} \cdot \sin^{2n}(\omega \cdot t) \cdot \cos(\omega \cdot t) +$$
$$U \cdot \omega \cdot \sum_{n=1}^{\infty} C_{2n-1} \cdot U^{2n-1} \cdot \sin^{2n-1}(\omega \cdot t) \cdot \cos(\omega \cdot t)$$

and, with A7a and A7c, rewrite A6a as $$i(t) = U \cdot \omega \cdot C_0 \cdot \cos(\omega \cdot t) + \qquad (A8)$$
$$U \cdot \omega \cdot \sum_{n=1}^{\infty} C_{2n} \cdot U^{2n} \cdot \frac{1}{2^{2n}} \cdot \binom{2n}{n} \cdot \cos(\omega \cdot t) + U \cdot \omega \cdot \sum_{n=1}^{\infty} C_{2n} \cdot U^{2n}$$
$$\frac{(-1)^n}{2^{2n-1}} \cdot \sum_{k=0}^{n-1} (-1)^k \cdot \binom{2n}{k} \cdot \cos[2 \cdot (n-k) \cdot \omega \cdot t] \cdot \cos(\omega \cdot t) +$$
$$U \cdot \omega \cdot \sum_{n=1}^{\infty} C_{2n-1} \cdot U^{2n-1} \cdot \frac{(-1)^{n-1}}{4^{n-1}} \cdot$$
$$\sum_{k=0}^{n-1} (-1)^k \cdot \binom{2n-1}{k} \cdot \sin[(2 \cdot (n-k) - 1) \cdot \omega \cdot t] \cdot \cos(\omega \cdot t)$$

We use the identities $$\cos(\alpha) \cdot \cos(\beta) = \frac{1}{2} \cdot [\cos(\alpha + \beta) + \cos(\alpha - \beta)] \qquad (A9a)$$

and $$\sin(\alpha) \cdot \cos(\beta) = \frac{1}{2} \cdot [\sin(\alpha + \beta) + \sin(\alpha - \beta)] \qquad (A9b)$$

to rewrite A8 as $$i(t) = \qquad (A10)$$
$$U \cdot \omega \cdot C_0 \cdot \cos(\omega \cdot t) + U \cdot \omega \cdot \sum_{n=1}^{\infty} C_{2n} \cdot U^{2n} \cdot \frac{1}{2^{2n}} \cdot \binom{2n}{n} \cdot \cos(\omega \cdot t) +$$
$$U \cdot \omega \cdot \sum_{n=1}^{\infty} C_{2n} \cdot U^{2n}$$
$$\frac{(-1)^n}{2^{2n}} \cdot \sum_{k=0}^{n-1} (-1)^k \cdot \binom{2n}{k} \cdot [\cos[(2 \cdot (n-k) + 1) \cdot \omega \cdot t] +$$
$$\cos[(2 \cdot (n-k) - 1) \cdot \omega \cdot t]] +$$
$$U \cdot \omega \cdot \sum_{n=1}^{\infty} C_{2n-1} \cdot U^{2n-1} \cdot \frac{(-1)^{n-1}}{2^{2n-1}} \cdot \sum_{k=0}^{n-1} (-1)^k \cdot \binom{2n-1}{k} \cdot$$
$$[\sin[2 \cdot (n-k) \cdot \omega \cdot t] + \sin[2 \cdot (n-k-1) \cdot \omega \cdot t]]$$

We can see that all even harmonics are generated by the terms on the last line of A10. This means that there are no even harmonics if all odd coefficients $C_{2n-1}$ on the third line are equal to zero. If all $C_{2n-1}$ are equal to zero, then the polynomial expression in A3 reduces to $$C(v) = C_0 + C_2 \cdot v^2 + C_4 \cdot v^4 + \ldots = \sum_{n=0}^{\infty} C_{2n} \cdot v^{2n} \qquad (A11)$$

It can be seen that for the expression in A11, $C(v)=C(-v)$, i.e., the $C(v)$ is axis-symmetric.

To elaborate in greater detail on why a number of VVCs in series, with a given total capacitance, has the best linearity when all VVCs are the same value: Consider the circuit in FIG. 27. A number (N) of VVCs in series are driven by a current source with the perfectly sinusoidal current $$i(t) = I \cdot \cos(\omega \cdot t) \qquad (B1)$$

where I is the magnitude, $\omega$ is the angular frequency of the current, and t is time. Let each VVC have an axis-symmetric capacitance vs. signal voltage (CV) curve so that even-numbered harmonics are suppressed. Each VVC in FIG. 27 might consist of two equal anti-series VVCs as shown in FIG. 2, or of two anti-parallel cascades of anti-series VVCs as shown in FIG. 4.

Let the value of each VVC have a monotonic CV curve normalized to a capacitance=1 when the applied signal voltage V and the bias voltage $V_B$ are both 0 (typical example shown in FIG. 6) multiplied by the respective constants $C_1 \ldots C_N$. Let $C_1 \ldots C_N$ be selected so that the total capacitance, when the bias voltage $V_B=0$, is $$C_{Tot} = \frac{1}{\sum_{j=1}^{N} \frac{1}{C_j}} \qquad (B2)$$

Given the CV curve of the VVCs and the signal voltages $V_1 \ldots V_N$ across them, the charge on the capacitor cascade can be calculated as $$Q = C_1 \cdot \int_0^{V_1} Cv(v)dv = C_2 \cdot \int_0^{V_2} Cv(v)dv = \ldots = C_N \cdot \int_0^{V_N} Cv(v)dv \qquad (B3)$$

or, with $$Qv(V) = \int_0^V Cv(v)dv \qquad (B4)$$

we get $$Q = C_1 \cdot Qv(V_1) = C_2 \cdot Qv(V_2) = \ldots = C_N \cdot Qv(V_N) \qquad (B5)$$

In principle we can solve B5 for the voltages $V_1 \ldots V_N$ to attain the voltages over any individual VVC j as a function of the charge on the VVC cascade $$V_j(q) = V_q\left(\frac{Q}{C_j}\right) \qquad (B6)$$

where $Vq(Q)$ is the inverse function of $Qv(v)$ and the index j is an integer from 1 to N. The total voltage across the VVC cascade is then $$V(Q) = \sum_{j=1}^{N} V_j(Q) = \sum_{j=1}^{N} Vq\left(\frac{Q}{C_j}\right) \quad \text{(B7)}$$

The charge on the VVC cascade as a function of time is $$Q(t) = \int i(t)dt = \frac{I}{\omega} \cdot \sin(\omega \cdot t) \quad \text{(B8)}$$

so that we can substitute B8 in B7 to obtain the voltage as a function of time $$V(t) = \sum_{j=1}^{N} Vq\left(\frac{Q(t)}{C_j}\right) \quad \text{(B9)}$$

Because the CV curves of the VVCs are axis-symmetric, the Qv curves of such devices, obtained by integration of the CV curves, are then symmetric about the origin (odd symmetry), which means that the inverse Qv functions (Vq curves) also exhibit odd symmetry. Such a Qv function can always be approximated by a polynomial of the form $$Vq(q) = U_1 \cdot q + U_2 \cdot q^3 + U_3 \cdot q^5 + \quad \text{(B10)}$$

Substituting B10 in B9 results in $$V(t) = U_1 \cdot \left(\frac{Q(t)}{C_1}\right) + U_2 \cdot \left(\frac{Q(t)}{C_1}\right)^3 + U_3 \cdot \left(\frac{Q(t)}{C_1}\right)^5 + \ldots + U_1 \cdot \left(\frac{Q(t)}{C_2}\right) + \quad \text{(B11)}$$
$$U_2 \cdot \left(\frac{Q(t)}{C_2}\right)^3 + U_3 \cdot \left(\frac{Q(t)}{C_2}\right)^5 + \ldots + \ldots +$$
$$U_1 \cdot \left(\frac{Q(t)}{C_N}\right) + U_2 \cdot \left(\frac{Q(t)}{C_N}\right)^3 + U_3 \cdot \left(\frac{Q(t)}{C_N}\right)^5 + \ldots V(t) =$$
$$U_1 \cdot \sum_{j=1}^{N} \frac{1}{C_j} \cdot Q(t) U_2 \cdot \sum_{j=1}^{N} \frac{1}{C_j^3} \cdot Q^3(t) + U_3 \cdot \sum_{j=1}^{N} \frac{1}{C_j^5} \cdot Q^5(t) + \ldots$$

or
We substitute B8 in B11

$$V(t) = U_1 \cdot \sum_{j=1}^{N} \frac{1}{C_j} \cdot \frac{I}{\omega} \cdot \sin(\omega \cdot t) + U_2 \cdot \sum_{j=1}^{N} \frac{1}{C_j^3} \cdot \left(\frac{I}{\omega}\right)^3 \cdot \sin^3(\omega \cdot t) + \quad \text{(B12)}$$
$$U_3 \cdot \sum_{j=1}^{N} \frac{1}{C_j^5} \cdot \left(\frac{I}{\omega}\right)^5 \cdot \sin^5(\omega \cdot t) + \ldots \text{ or } V(t) =$$
$$\sum_{n=1}^{M} U_n \cdot \sum_{j=1}^{N} \frac{1}{C_j^{2n-1}} \cdot \left(\frac{I}{\omega}\right)^{2n-1} \cdot \sin^{2n-1}(\omega \cdot t)$$

where M is the number of coefficients in the polynomial. It may be finite or infinite. We use A7c in B12 to obtain $$V(t) = \sum_{n=1}^{M} U_n \cdot \sum_{j=1}^{N} \frac{1}{C_j^{2n-1}} \cdot \left(\frac{I}{\omega}\right)^{2n-1} \cdot \frac{(-1)^{n-1}}{4^{n-1}} \cdot \quad \text{(B13)}$$
$$\sum_{k=0}^{n-1} (-1)^k \cdot \binom{2n-1}{k} \cdot \sin[(2 \cdot (n-k) - 1) \cdot \omega \cdot t]$$

where $$\binom{n}{k}$$

again denotes the number of combinations each of size k that can be formed from n objects, or $$\binom{n}{k} = \frac{n!}{(n-k) \cdot k!}$$

! designates the faculty operator, i.e., n!=1·2·3·...·n. B13 can also be written as $$V(t) = \sum_{n=1}^{M} (-1)^{n-1} \cdot \left[\sum_{k=0}^{M-n} \frac{U_{n+k}}{4^{n+k-1}} \cdot \sum_{j=1}^{N} \frac{1}{C_j^{2n-1}} \cdot \left(\frac{I}{\omega}\right)^{2(n+k)-1} \cdot \binom{2(n+k)-1}{k}\right] \cdot \quad \text{(B14)}$$
$$\sin((2n-1) \cdot \omega \cdot t)$$

We define $$A_n = \sum_{k=0}^{M-n} \frac{U_{n+k}}{4^{n+k-1}} \cdot \sum_{j=1}^{N} \frac{1}{C_j^{2n-1}} \cdot \left(\frac{I}{\omega}\right)^{2(n+k)-1} \cdot \binom{2(n+k)-1}{k} \quad \text{(B15)}$$

where $A_n$ is the magnitude of $n^{th}$ odd harmonic of V(t). Substituting in B14 gets $$V(t) = \sum_{n=1}^{M} (-1)^{n-1} \cdot A_n \cdot \sin((2n-1) \cdot \omega \cdot t) \quad \text{(B16)}$$

For any harmonics to be minimal, the values of $C_1 \ldots C_N$ must be chosen so that the corresponding coefficient $A_n$ is minimal. We require that the total capacitance with no voltages applied remains constant. As our variables we will use $C_1 \ldots C_{N-1}$, which, per B2, will define $C_N$. We solve (B2) for $C_N$ $$C_N = \cfrac{1}{\cfrac{1}{C_{Tot}} - \sum_{j=1}^{N-1} \cfrac{1}{C_j}} \quad (B17)$$

and see from B15 that, to minimize any coefficient $A_n$, we must select $C_1 \ldots C_{N-1}$ so that, for any integer $m>1$, $$\sum_{j=1}^{N}\left(\frac{1}{C_j}\right)^m = \sum_{j=1}^{N-1}\left(\frac{1}{C_j}\right)^m + \left(\frac{1}{C_{Tot}} - \sum_{j=1}^{N-1}\frac{1}{C_j}\right)^m = \text{minimal} \quad (B18)$$

We compute the partial derivatives of B18 over each $C_1 \ldots C_{N-1}$ and require that these be zero, i.e.

$$m \cdot \left[\left(\frac{1}{C_{Tot}} - \sum_{j=1}^{N-1}\frac{1}{C_j}\right)^{m-1} - \left(\frac{1}{C_1}\right)^{m-1}\right] \cdot \frac{1}{C_1^2} = 0 \quad (B19.1)$$

$$m \cdot \left[\left(\frac{1}{C_{Tot}} - \sum_{j=1}^{N-1}\frac{1}{C_j}\right)^{m-1} - \left(\frac{1}{C_2}\right)^{m-1}\right] \cdot \frac{1}{C_2^2} = 0 \quad (B19.2)$$

$$\ldots$$

$$m \cdot \left[\left(\frac{1}{C_{Tot}} - \sum_{j=1}^{N-1}\frac{1}{C_j}\right)^{m-1} - \left(\frac{1}{C_{N-1}}\right)^{m-1}\right] \cdot \frac{1}{C_{N-1}^2} = 0 \quad (B19.[N-1])$$

B19 is a system of N−1 equations with N−1 unknowns, the solutions of which result in the extremes (minima or maxima) of B18. We note that one solution is when $C_1=C_2=\ldots C_{N-1}=$infinite, which constitutes a maximum of B18. For each $j=1 \ldots N-1$ we multiply each equation B19.j by $C_j^2/m$, add $$\left(\frac{1}{C_j}\right)^{m-1}$$

to each side, take the $(m-1)^{th}$ root on each side, and add $$\sum_{j=1}^{N-1} \frac{1}{C_j}$$

to each side. This results in the system of linear equations $$\frac{1}{C_{Tot}} = \frac{2}{C_1} + \frac{1}{C_2} + \ldots + \frac{1}{C_{N-1}} \quad (B20.1)$$

$$\frac{1}{C_{Tot}} = \frac{1}{C_1} + \frac{2}{C_2} + \ldots + \frac{1}{C_{N-1}} \quad (B20.2)$$

$$\ldots$$

$$\frac{1}{C_{Tot}} = \frac{1}{C_1} + \frac{1}{C_2} + \ldots + \frac{2}{C_{N-1}} \quad (B20.[N-1])$$

It can be seen that one solution to this system of equations is $$C_1=C_2=\ldots =C_{N-1}=N \cdot C_{Tot}$$

which, together with B17, means that $C_N=0$, so that $$C_1=C_2=\ldots C_{N-1}=C_N=N \cdot C_{Tot} \quad (B21)$$

Because in general a system of linear equations has only one unique solution, in general B21 is the solution that minimizes B18. This means that the harmonics are minimal when both VVCs are identical.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. An apparatus that receives a signal voltage, the apparatus comprising:
a capacitive network that includes a first half cell connected in parallel with a second half cell,
wherein the first half cell comprises a circuit with two or more voltage variable capacitors (VVCs) configured in anti-series in which a first VVC of said two or more VVCs with a same bias voltage orientation as the signal voltage associated with said apparatus assumes one capacitance and a second VVC of said two or more VVCs with an opposite bias voltage orientation as the signal voltage assumes another capacitance, and
wherein the second half cell comprises a circuit with two or more VVCs configured in anti-series in which a third VVC of said two or more VVCs with the same bias voltage orientation as the signal voltage associated with said apparatus assumes the same values as said anti-oriented VVCs in said first half cell and a fourth VVC with the opposite bias voltage orientation as the signal voltage assumes the same values as said like-oriented VVCs in said first half cell;
a first Direct Current (DC) feed connected between the first VVC and the second VVC; and
a second DC feed connected between the third VVC and the fourth VVC,
wherein said VVCs are voltage tunable dielectric capacitors,
wherein values for the voltage tunable dielectric capacitors are selected based on reducing an error function over a desired range of bias and signal voltages as a function of a capacitance-voltage curve that numerically models the voltage tunable dielectric capacitors, and
wherein the error function is based on a change in a net capacitance of the capacitive network.

2. The apparatus of claim 1, further comprising resistors or inductors connected to each node in said first and said second half-cells so that each node can be connected to either ground or a bias voltage source.

3. An apparatus that receives a signal voltage, the apparatus comprising:
a capacitive network that includes a first half cell connected in parallel with a second half cell,
wherein the first half cell comprises a circuit with two or more voltage variable capacitors (VVCs) configured in anti-series in which a first VVC of said two or more VVCs with a same bias voltage orientation as the signal voltage associated with said apparatus assumes one capacitance and a second VVC of said two or more VVCs with an opposite bias voltage orientation as the signal voltage assumes another capacitance, and
wherein the second half cell comprises a circuit with two or more VVCs configured in anti-series in which a third VVC of said two or more VVCs with the same bias voltage orientation as the signal voltage associated with said apparatus assumes the same values as said anti-oriented VVCs in said first half cell and a fourth VVC with the opposite bias voltage orientation as the signal voltage assumes the same values as said like-oriented VVCs in said first half cell;

a first Direct Current (DC) feed connected between the first VVC and the second VVC; and a second DC feed connected between the third VVC and the fourth VVC, wherein said apparatus is adapted to allow for a desired total capacitance minimally dependent of said signal voltage by setting a required bias voltage, wherein values for the VVCs are selected based on reducing an error function over a desired range of the received signal voltage as a function of a capacitance-voltage curve associated with the VVCs, and wherein the error function is based on a change in a net capacitance of the capacitive network.

4. The apparatus of claim 3, further comprising resistors or inductors connected to each node in said cell so that each node can be connected to either ground or a bias voltage source.

5. The apparatus of claim 3, wherein said two or more voltage variable capacitors in said first-half and said second-half cell are configured to be fixed capacitors.

6. The apparatus of claim 3, further comprising at least one additional cell cascaded in series with said first half cell and said second half cell, and said signal voltage is an AC signal.

7. The apparatus of claim 3, wherein said VVCs are voltage tunable dielectric capacitors.

8. The apparatus of claim 3, wherein at least two dielectrics of said VVCs employ ferroelectric materials.

9. The method of claim 3, wherein the error function is a logarithmic function of the change in the net capacitance.

10. A method comprising:

selecting using a processor, a numerical model for a tunable capacitive network, wherein the tunable capacitive network comprises a first half cell connected in parallel with a second half cell, wherein the first half cell includes a first circuit having first and second voltage variable capacitors (VVCs) configured in anti-series in which the first VVC with a same bias voltage orientation as a received signal voltage assumes a first capacitance and the second VVC with an opposite bias voltage orientation as the received signal voltage assumes a second capacitance, and wherein the second half cell includes a second circuit having third and fourth VVCs configured in anti-series in which the third VVC with the same bias voltage orientation as the received signal voltage assumes the second capacitance and the fourth VVC with the opposite bias voltage orientation as the received signal voltage assumes the first capacitance, wherein a first Direct Current (DC) feed is connected between the first VVC and the second VVC, and wherein a second DC feed is connected between the third VVC and the fourth VVC;

selecting using the processor, an error function based on a change in a net capacitance of the tunable capacitive network or its reciprocal as a function of the numerical model, a signal voltage associated with the tunable capacitive network and a bias voltage associated with the tunable capacitive network; and selecting capacitance values for the tunable capacitive network using the processor, to reduce the error function over a desired range of the bias and signal voltages as a function of the numerical model.

11. The method of claim 10, further comprising applying numerical methods to select the capacitance values.

12. The method of claim 10, wherein the numerical model is associated with a capacitance-voltage curve.

13. The method of claim 10, wherein the first half cell and the second half cell each comprise more than two VVCs.

14. The method of claim 10, wherein at least some capacitors of the tunable capacitive network comprise thin-film dielectric material.

15. The method of claim 10, wherein the received signal voltage is an AC voltage.

16. The method of claim 10, wherein at least some capacitors of the tunable capacitive network are fixed capacitors.

17. The method of claim 10, wherein the tunable capacitive network comprise resistors connected to nodes of the tunable capacitive network for connecting the nodes with at least one of a ground and a bias voltage source.

18. The method of claim 10, wherein the tunable capacitive network comprise conductors connected to nodes of the tunable capacitive network for connecting the nodes with at least one of a ground and a bias voltage source.

19. The method of claim 10, wherein the error function is a logarithmic function of the change in the net capacitance.

20. The method of claim 10, wherein at least some capacitors of the tunable capacitive network comprise ferroelectric material.

* * * * *